(12) United States Patent
Seshadri et al.

(10) Patent No.: US 8,724,375 B2
(45) Date of Patent: May 13, 2014

(54) SRAM CELL HAVING AN N-WELL BIAS

(71) Applicant: Texas Instruments Incorporated, Dallas, TX (US)

(72) Inventors: Anand Seshadri, Richardson, TX (US); Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/758,692

(22) Filed: Feb. 4, 2013

(65) Prior Publication Data

US 2013/0148416 A1    Jun. 13, 2013

Related U.S. Application Data

(62) Division of application No. 13/196,042, filed on Aug. 2, 2011.

(60) Provisional application No. 61/414,301, filed on Nov. 16, 2010.

(51) Int. Cl.
*G11C 11/00*        (2006.01)

(52) U.S. Cl.
USPC ........................................ 365/154; 365/156

(58) Field of Classification Search
USPC ................................................. 365/154, 156
See application file for complete search history.

(56) References Cited

U.S. PATENT DOCUMENTS

| | | | |
|---|---|---|---|
| 4,623,989 A | 11/1986 | Blake | |
| 7,307,907 B2 * | 12/2007 | Houston | 365/154 |
| 7,313,039 B2 * | 12/2007 | Hong | 365/154 |
| 7,742,326 B2 * | 6/2010 | Houston | 365/154 |
| 7,894,280 B2 * | 2/2011 | Houston | 365/154 |
| 8,107,279 B2 * | 1/2012 | Yamaoka et al. | 365/154 |
| 8,351,248 B1 * | 1/2013 | Hart | 365/156 |
| 8,379,435 B2 * | 2/2013 | McMullan et al. | 365/156 |
| 2012/0119824 A1 | 5/2012 | Seshadri et al. | |
| 2012/0195108 A1 | 8/2012 | Seshadri et al. | |

OTHER PUBLICATIONS

Muhammad Khellah et al. "PVT-Variations and Supply-Noise Tolerant 45nm Dense Cache Arrays with Diffusion-Notch-Free (DNF) 6T SRAM Cells and Dynamic Multi-Vcc Circuits," 2008 Symposium on VLSI Circuits Digest of Technical Papers pp. 48-49.

* cited by examiner

*Primary Examiner* — Trong Phan
(74) *Attorney, Agent, or Firm* — Rose Alyssa Keagy; Wade J. Brady, III; Frederick J. Telecky, Jr.

(57) ABSTRACT

A method for writing a low data bit value, writing a high data bit value, and reading a data bit value of an addressed SRAM cell. The method may include adjusting a bias level of the n-wells that contain the bit driver, bit-bar driver, bit passgate, and optional bit-bar passgate.

12 Claims, 22 Drawing Sheets

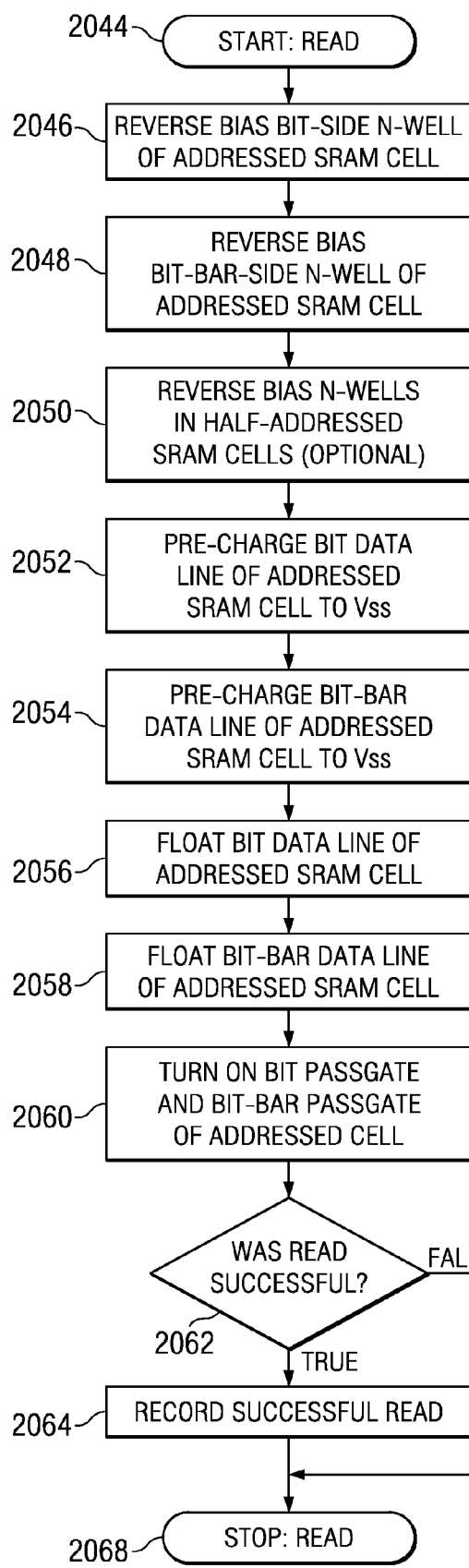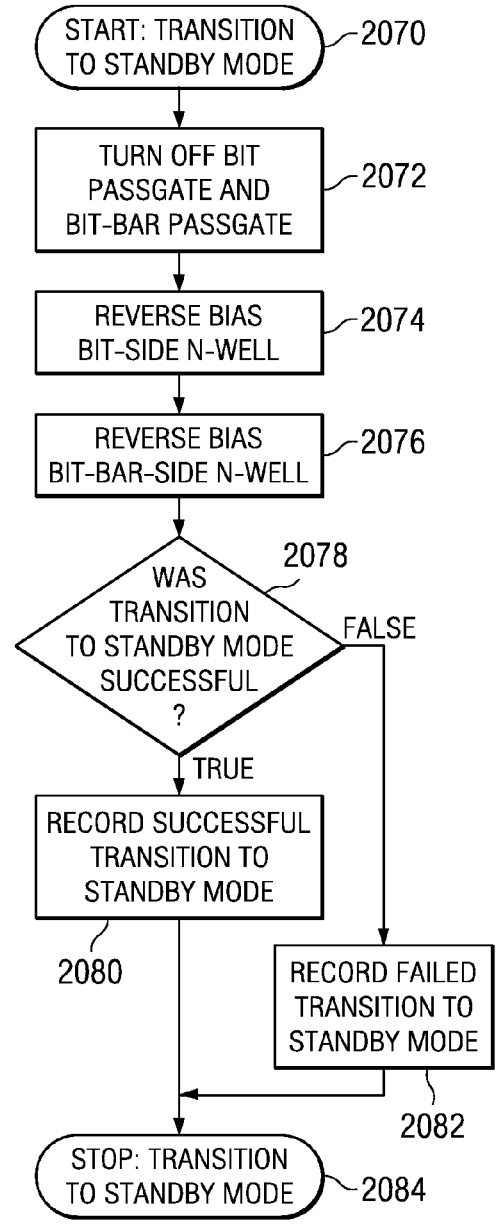
FIG. 2C
FIG. 2D

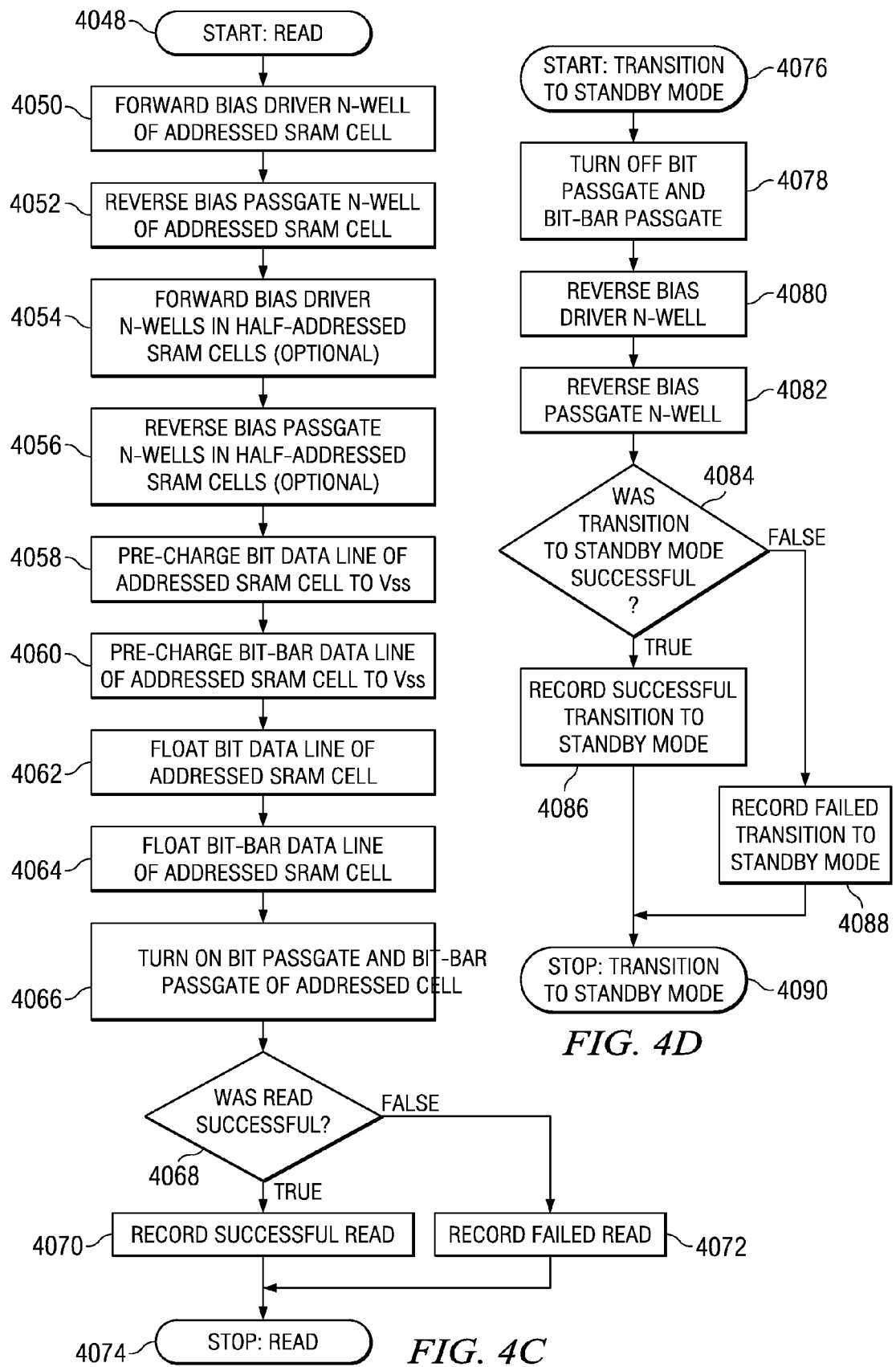

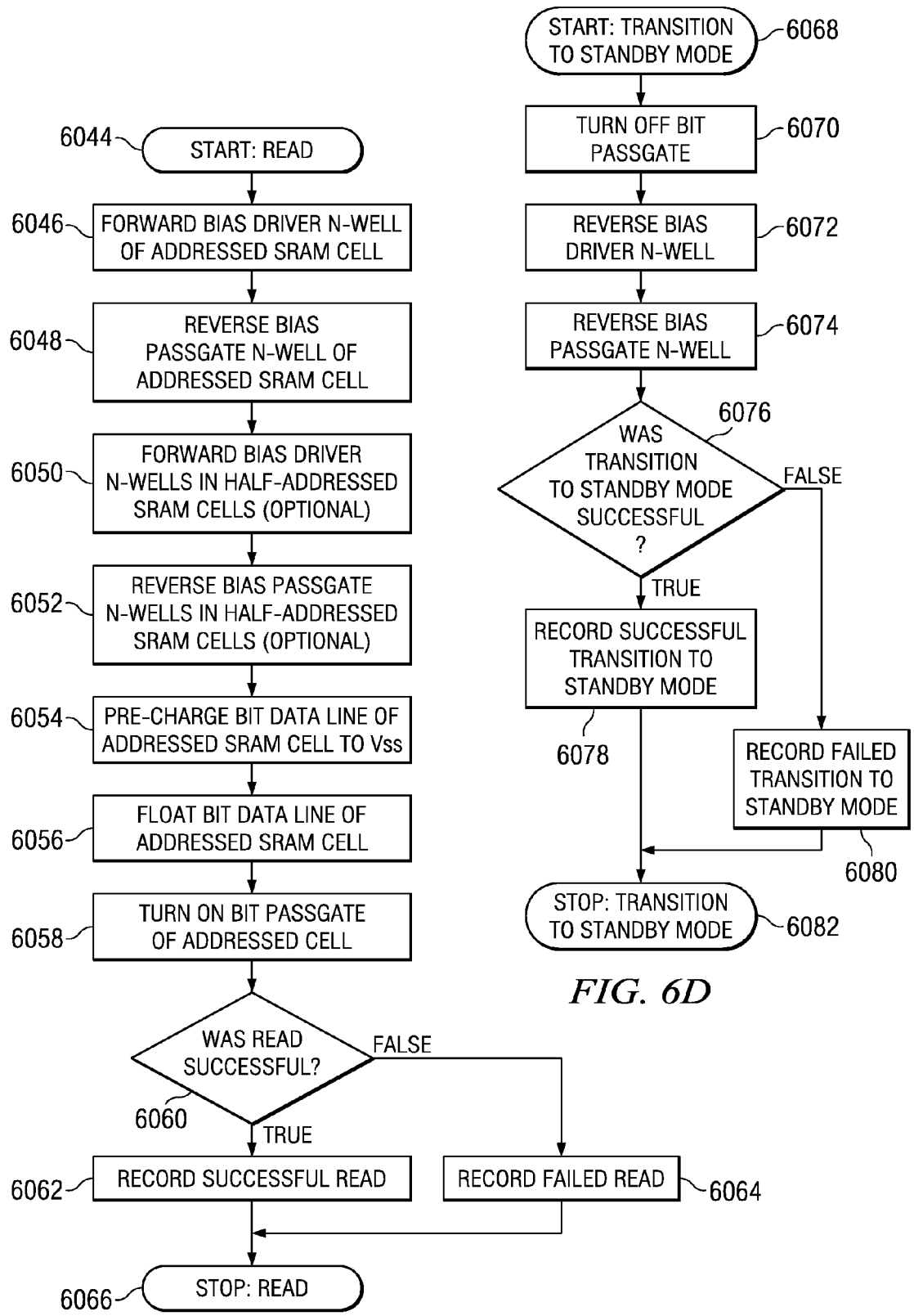

SRAM CELL HAVING AN N-WELL BIAS

CROSS-REFERENCE TO RELATED APPLICATIONS

This application is a division of application Ser. No. 13/196,042, filed Aug. 2, 2011, which claims the benefit of priority under U.S.C. §119(e) to U.S. Provisional Application 61/414,301 (filed Nov. 16, 2010, and titled "SRAM Cells Using Nwell Bias with PMOS Driver and Pass and NMOS Load Transistors").

Moreover, this application is related to patent application Ser. No. 13/196,058 (filed simultaneously with this application) entitled "Bias Voltage Source", and patent application Ser. No. 13/196,010 (also filed simultaneously with this application) entitled "SRAM Cell Having a P-Well Bias". With their mention in this section, these patent applications are not admitted to be prior art with respect to the present application.

BACKGROUND

This invention relates to the field of integrated circuits. More particularly, this invention relates to static random access memories (SRAMs).

DESCRIPTION OF THE VIEWS OF THE DRAWING

FIG. 2A through FIG. 2D are flowcharts of a write low operation, a write high operation, a read operation, and a transition to standby mode, respectively, for an SRAM array according to the first embodiment.

FIG. 4A through FIG. 4D are flowcharts of a write low operation, a write high operation, a read operation, and a transition to standby mode, respectively, for an SRAM array according to the second embodiment.

FIG. 6A through FIG. 6D are flowcharts of a write low operation, a write high operation, a read operation, and a transition to standby mode, respectively, for an SRAM array according to the third embodiment.

DETAILED DESCRIPTION

Figure 1:
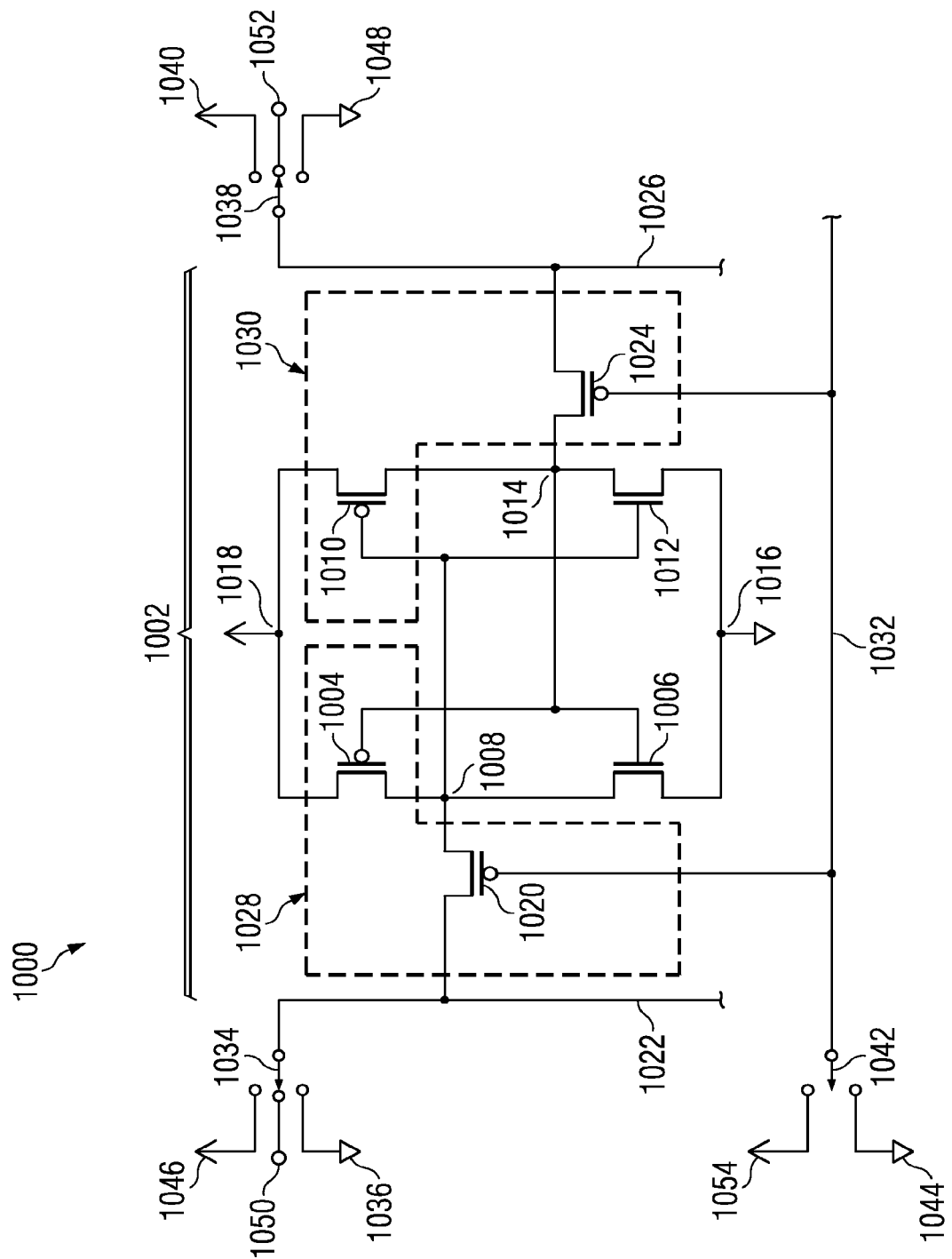
FIG. 1 is a circuit diagram of an SRAM cell in an SRAM cell array contained in an integrated circuit according to the first embodiment of the instant invention.

The example embodiments are described with reference to the attached figures, wherein like reference numerals are used throughout the figures to designate similar or equivalent elements. The figures are not drawn to scale and they are provided merely to illustrate the example embodiments. Several aspects are described below with reference to example applications for illustration. It should be understood that numerous specific details, relationships, and methods are set forth to provide a full understanding of the example embodiments. One skilled in the relevant art, however, will readily recognize that the example embodiments can be practiced without one or more of the specific details or with other methods. In other instances, well-known structures or operations are not shown in detail to avoid obscuring the embodiment. The example embodiments are not limited by the illustrated ordering of acts or events, as some acts may occur in different orders and/or concurrently with other acts or events. Furthermore, not all illustrated acts or events are required to implement a methodology in accordance with the example embodiments.

For the purposes of this disclosure, the term "Vdd" is understood to refer to a power supply node with a potential suitable for source nodes of p-channel metal oxide semiconductor (PMOS) transistors. The term "high voltage" is understood to mean a potential substantially equal to Vdd. Similarly, the term "Vss" is understood to refer to a power supply node with a potential suitable for source nodes of n-channel metal oxide semiconductor (NMOS) transistors. The Vss potential is lower than the Vdd potential. The term "low voltage" is understood to mean a potential substantially equal to Vss. The term "floated" is understood to mean disconnected from a voltage source such as Vdd or Vss, or connected to a voltage source through a high impedance device.

Also in this disclosure, the term "driver transistor" is understood to refer to a metal oxide semiconductor (MOS) transistor in an SRAM cell. A drain node of the driver transistor is connected to a data node of the SRAM cell. A gate node of the driver transistor is connected to an opposite data node of the SRAM cell from the driver drain node. A source node of the driver transistor is connected to a power supply node (typically either Vdd for PMOS driver transistors or Vss for NMOS driver transistors). A polarity of the driver transistor source node power supply is opposite a polarity of a read operation pre-charge potential of a corresponding data line that is connected to the driver transistor through a passgate transistor. That is, SRAM cells that pre-charge data lines to a high voltage have NMOS driver transistors, while SRAM cells that pre-charge data lines to a low voltage have PMOS driver transistors.

Conversely, the term "load transistor" is understood to refer to another MOS transistor in the SRAM cell. A drain node of the load transistor is connected to a data node of the SRAM cell. A gate node of the load transistor is connected to an opposite data node of the SRAM cell from the load drain node. A source node of the load transistor is connected to a power supply node, typically either Vdd for PMOS driver transistors or Vss for NMOS driver transistors. A polarity of the load transistor source node power supply is the same as the polarity of a read operation pre-charge potential of a corresponding data line which is connected to the driver transistor through a passgate transistor; that is, SRAM cells which pre-charge data lines to a high voltage have PMOS load transistors, while SRAM cells which pre-charge data lines to a low voltage have NMOS load transistors.

The term "passgate transistor" is understood to refer to yet another MOS transistor in the SRAM cell, of which one source/drain node is connected to a data node of the SRAM cell and an opposite source/drain node is connected to a corresponding data line of the SRAM cell.

For the purposes of this disclosure, the term "bit-side" is understood to refer to components such as a driver transistor, load transistor and passgate transistor connected a data node in an SRAM cell. Conversely, the term "bit-bar-side" is understood to refer to components connected to an opposite data node from the bit-side node in the SRAM cell. A bit-side data line is commonly referred to as a bit line. A bit-bar-side data line is commonly referred to as a bit-bar line. A bit-side driver transistor is commonly referred to as a bit driver; similarly a bit-bar-side driver transistor is commonly referred to as a bit-bar driver. A bit-side load transistor is commonly referred to as a bit load; similarly a bit-bar-side load transistor is commonly referred to as a bit-bar load. A bit-side passgate transistor is commonly referred to as a bit passgate; similarly a bit-bar-side passgate transistor is commonly referred to as a bit-bar passgate.

Also for the purposes of this disclosure, the term "addressed SRAM cell" is understood to refer to an SRAM cell in which a passgate transistor (plus a second passgate transistor if present) are turned on, and a bit data line (plus a bit-bar line if present) are connected to read circuitry or write circuitry. The term "half-addressed SRAM cell" is understood to refer to an SRAM cell in which a passgate transistor (plus a second passgate transistor if present) are turned on, while a bit data line (plus a bit-bar line if present) are disconnected from read or write circuitry.

In some instances of integrated circuits containing SRAM cell arrays, substantially all circuits in the integrated circuit are dedicated to the operation of the SRAM array. In these instances, the circuits that provide data to be stored in the SRAM array and the circuits that use data from the SRAM array are located outside the integrated circuit containing the SRAM array. In other instances of integrated circuits containing SRAM cell arrays—such as microprocessors, digital signal processors and wireless telephony controllers—the circuits that provide data to be stored in the SRAM array and the circuits that use data from the SRAM array are located within the integrated circuit.

The instant invention provides an integrated circuit containing an SRAM cell array in which a bit driver, a bit-bar driver, a bit passgate and an optional bit-bar passgate are PMOS transistors The SRAM cell array also has a bit load and a bit-bar load that are NMOS transistors. Bias levels of the n-type wells ("n-wells") that contain the bit driver, bit-bar driver, bit passgate, and the optional bit-bar passgate are adjusted during write, read, and transition to standby operations. The bias levels are adjusted to reduce write failures, read failures and leakage current in standby mode (compared to SRAM cells using constant bias on n-wells).

In a first embodiment, an SRAM cell contains a bit driver, a bit-bar driver, a bit load and a bit-bar load, a bit passgate, and a bit-bar passgate. The bit-side n-well contains the bit driver and the bit passgate. In addition, the bit-bar-side n-well contains the bit-bar driver and the bit-bar passgate.

In a second embodiment, an SRAM cell contains a bit driver, a bit-bar driver, a bit load and a bit-bar load, a bit passgate, and a bit-bar passgate. The driver n-well contains the bit driver and the bit-bar driver. In addition, the passgate n-well contains the bit passgate and the bit-bar passgate.

In a third embodiment, an SRAM cell contains a bit driver, a bit-bar driver, a bit load, and a bit-bar load, and a bit passgate. The driver n-well contains the bit driver and the bit-bar driver. In addition, the passgate n-well contains the bit passgate.

In a fourth embodiment, an SRAM cell contains a bit driver, a bit-bar driver, a bit load, a bit-bar load, and a bit passgate. The first n-well contains the bit driver. In addition, the second n-well contains the bit-bar driver and the bit passgate.

In a fifth embodiment, an SRAM cell contains a bit driver, a bit-bar driver, a bit load, a bit-bar load, and a bit passgate. A bit driver n-well contains the bit driver. In addition, the bit-bar driver n-well contains the bit-bar driver. Furthermore, the passgate n-well contains the bit passgate.

FIG. 1 is a circuit diagram of an SRAM cell in an SRAM cell array contained within an integrated circuit formed according to the first embodiment. The integrated circuit (1000) contains the SRAM cell (1002) as part of the SRAM cell array. The SRAM cell (1002) includes a bit driver (1004) and a bit load (1006). A drain node of the bit driver (1004) and a drain node of the bit load (1006) are connected to a bit-side data node (1008). The SRAM cell (1002) also includes a bit-bar driver (1010) and bit-bar load (1012). A drain node of the bit-bar driver (1010) and a drain node of the bit-bar load (1012) are connected to a bit-bar-side data node (1014). A source node of the bit load (1006) and a source node of the bit-bar load (1012) are connected to a Vss node (1016). A source node of the bit driver (1004) and a source node of the bit-bar driver (1010) are connected to a Vdd node (1018). A gate node of the bit driver (1004) and a gate node of the bit load (1006) are connected to the bit-bar-side data node (1014). Similarly, a gate node of the bit-bar driver (1010) and a gate node of the bit-bar load (1012) are connected to the bit-side data node (1008).

The SRAM cell (1002) also includes a PMOS bit passgate (1020). A first source/drain node of the bit passgate (1020) is connected to the bit-side data node (1008) and a second source/drain node of the bit passgate (1020) is connected to a bit data line (1022).

The SRAM cell (1002) further includes a PMOS bit-bar passgate (1024). A source/drain node of the bit-bar passgate (1024) is connected to the bit-bar-side data node (1014) and a second source/drain node of the bit-bar passgate (1024) is connected to a bit-bar data line (1026).

The integrated circuit (1000) is formed on a p-type substrate. The bit driver (1004) and bit passgate (1020) are contained in a bit-side n-well (1028). The bit-bar driver (1010) and bit-bar passgate (1024) are contained in a bit-bar-side n-well (1030). The bit-side n-well (1028) and bit-bar-side n-well (1030) are formed in the p-type substrate of the integrated circuit. For example, the bit-side n-well (1028) and bit-bar-side n-well (1030) may be formed by ion implanting an n-well set of n-type dopants (such as phosphorus and arsenic, and possibly antimony) at doses from $1 \cdot 10^{11}$ to $1 \cdot 10^{14}$ atoms/cm$^2$, into the regions defined for the bit-side n-well (1028) and bit-bar-side n-well (1030). An n-well photoresist pattern (not shown) is commonly used during the implantation process to define the regions for the bit-side n-well (1028) and bit-bar-side n-well (1030). The bit-side n-well (1028) and bit-bar-side n-well (1030) extend from a top surface of the substrate to depths typically between 400 and 700 nanometers. The ion implantation process to form the bit-side n-well (1028) and bit-bar-side n-well (1030) may include additional steps to implant additional n-type dopants at shallower depths for purposes of improving PMOS transistor performance (such as threshold adjustment, leakage current reduction and suppression of parasitic bipolar operation). Sheet resistivities of the bit-side n-well (1028) and the bit-bar-side n-well (1030) are commonly between 100 and 1000 ohms/square. In a preferred embodiment, the bit-side n-well (1028) is electrically connected to bit-side n-wells in other SRAM cells within the integrated circuit that are located in a same column as the SRAM cell (1002). Similarly, the bit-bar-side n-well (1030) is preferably electrically connected to bit-bar-side n-wells in other SRAM cells in the same column as the SRAM cell (1002).

In a preferred embodiment, an average on-state current of the bit passgate (1020) is between 60 percent and 80 percent of an average on-state current of the bit driver (1004) (i.e. when the bit-side n-well (1028) is biased at Vdd, the source nodes of the bit passgate (1020) and bit driver (1004) are biased at Vdd, and the drain nodes of the bit passgate (1020) and bit driver (1004) are biased at Vss). Similarly, an average on-state current of the bit-bar passgate (1024) is between 60 percent and 80 percent of an average on-state current of the bit-bar driver (1010) (i.e. when the bit-bar-side n-well (1030) is biased at Vdd, the source nodes of the bit-bar passgate (1024) and bit-bar driver (1010) are biased at Vdd, and the drain nodes of the bit-bar passgate (1024) and bit-bar driver (1010) are biased at Vss).

A gate node of the bit passgate (1020) and a gate node of the bit-bar passgate (1024) are connected to a word line (1032). It is common for the bit data line (1022) and the bit-bar data line (1026) to be connected to passgates in other SRAM cells in the same column as the SRAM cell (1002) (not shown). Furthermore, it is common for the word line (1032) to be connected to passgates in other SRAM cells in a same row as the SRAM cell (1002) (not shown).

The bit-bar data line (1026) is coupled to a high voltage source or a low voltage source. Specifically, a bit-bar data line switch (1038) may be used to couple the bit-bar data line (1026) to a high voltage source such as the bit-bar data line Vdd node (1040) or a low voltage source such as bit-bar data line Vss node (1048).

A write low operation results in a low voltage on the bit-side data node (1008). During the write low operation on the SRAM cell (1002), a bias potential on the bit-bar-side n-well (1030) is decreased. This is commonly referred to as forward biasing because potential differences across the pn junctions that exist between the bit-bar-side n-well (1030) and the source nodes of the bit-bar passgate (1024) and bit-bar driver (1010) are shifted toward a forward bias condition. Forward biasing the bit-bar-side n-well (1030) desirably increases a ratio of the on state current of the bit-bar passgate (1024) to the on state current of the bit-bar driver (1010). Optionally, the bit-side n-well (1028) may also be forward biased so as to desirably increase a ratio of the on state current of the bit passgate (1020) to the on state current of the bit driver (1004). Forward biasing the bit-bar-side n-well (1030) during a write low operation may reduce write failures by increasing a transfer function of the potential on the bit-bar data line (1026) to the bit-bar-side data node (1014). (Write failures are write operations in which potentials on bit data lines are not successfully transferred to bit-side data nodes and stabilized.) Forward biasing the bit-side n-well (1028) during a write low operation may also reduce write failures by increasing a transfer function of the potential on the bit data line (1022) to the bit-side data node (1008).

The write low operation continues with turning on the bit passgate (1020) and the bit-bar passgate (1024) by coupling the word line (1032) to a low voltage source such as Vss (for example, by coupling a word line switch (1042) to the word line Vss node (1044)). As a result, a potential substantially equal to Vss on the bit data line (1022) is transferred to the bit-side data node (1008), plus the potential substantially equal to Vdd on the bit-bar data line (1026) is transferred to the bit-bar-side data node (1014).

During a write low operation, biases on bit-side n-wells and bit-bar-side n-wells in half-addressed SRAM cells may be increased. This is commonly referred to as reverse biasing because potential differences across the pn junctions that are between the bit-bar-side n-well (1030) and the source nodes of the bit-bar passgate (1024) and bit-bar driver (1010) are shifted so that the reverse bias condition is increased. Reverse biasing bit-side n-wells and bit-bar-side n-wells in half-addressed SRAM cells may decrease the ratios of on state currents of the passgate transistors to on the state currents of driver transistors in half-addressed SRAM cells. This may reduce data upsets in the half addressed SRAM cells by providing lower resistance paths from the bit-side data nodes to Vss and Vdd in the half addressed SRAM cells. (Data upsets are events in which data bits stored in the half-addressed SRAM cells become inverted, For example a "1" value is changed to a "0" value and vice versa.)

Figure 2A:
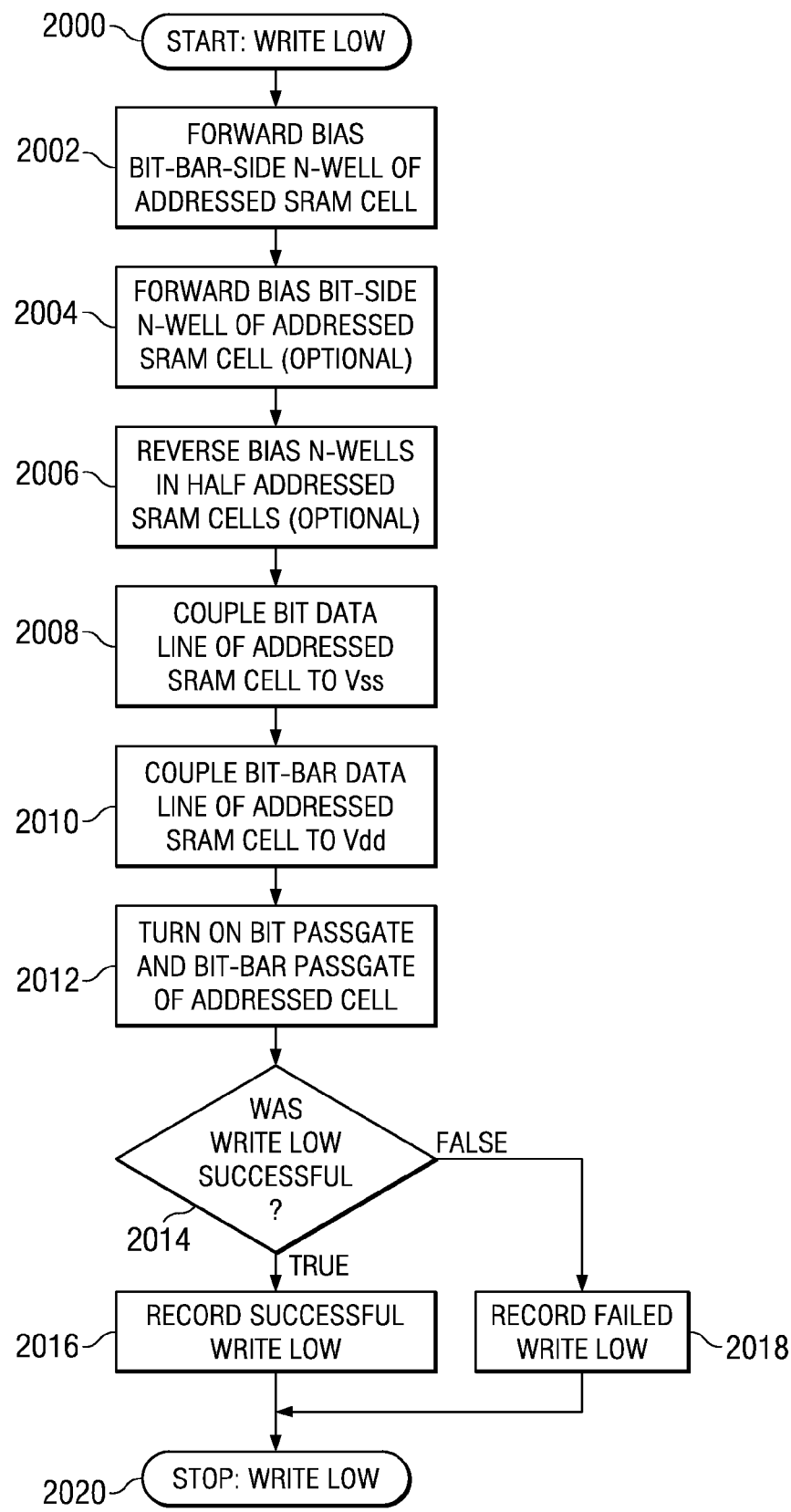

FIG. 2A through FIG. 2D are flowcharts of a write low operation, a write high operation, a read operation, and a transition to standby mode operation, respectively. The flowcharts in FIG. 2A through FIG. 2D refer to the example addressed SRAM cell (1002) as depicted in FIG. 1. Referring to FIG. 2A, the write low operation begins (2000) with step (2002) which is to forward bias a bit-bar-side n-well (1030) of the addressed SRAM cell (1002). Step (2004) may then be executed, which is to optionally forward bias a bit-side n-well (1028) of the addressed SRAM cell. Step (2006) may then be executed, which is to optionally reverse bias the bit-side n-wells and bit-bar-side n-wells in half-addressed SRAM cells. Then, in step (2008) a bit data line (1022) of the addressed SRAM cell is coupled to Vss (1036). In step (2010) a bit-bar data line (1026) of the addressed SRAM cell is coupled to Vdd (1040). Following execution of steps (2008) and (2010), step (2012) is executed, which is to turn on a bit passgate (1020) and a bit-bar passgate (1024) of the addressed SRAM cell.

In embodiments of the write low operation that are part of test operations, following the execution of step (2012), step (2014) is determining whether a low voltage was successfully transferred to a bit-side data node (1008) and a high voltage was successfully transferred to a bit-bar-side data node (1014). If the low voltage was successfully transferred to the bit-side data node and the high voltage was successfully transferred to the bit-bar-side data node, then step (2016) is to record a successful write low operation for the addressed SRAM cell. Conversely, if the low voltage was not successfully transferred to the bit-side data node or the high voltage was not successfully transferred to the bit-bar-side data node, then step (2018) is to record a failed write low operation for the addressed SRAM cell. After step (2016) or step (2018) is executed—or after step (2012) is executed in embodiments which are not part of test operations—the write low operation is ended at step (2020). In other embodiments of the write low operation, steps (2002), (2004), (2006), (2008) and (2010) may be performed in any order.

Referring back to FIG. 1, a write high operation may be performed on the SRAM cell (1002) that results in a high voltage on the bit-side data node (1008). In a write high operation, the bit data line (1022) is coupled to a high voltage source such as Vdd. For example, the bit data line (1022) may be coupled to the bit data line Vdd node (1046) through the bit data line switch (1034). In addition, the bit-bar data line (1026) is coupled to a low voltage source such as Vss. For example, the bit-bar data line (1026) may be coupled to the bit data line Vss node (1048) through the bit-bar data line switch (1038).

During the write high operation on the SRAM cell (1002), the bit-side n-well (1028) is forward biased to possibly increase the ratio of the on state current of the bit passgate (1020) to the on state current of the bit driver (1004). Optionally, the bit-bar-side n-well (1030) may also be forward biased so as to possibly increase the ratio of the on state current of the bit-bar passgate (1024) to the on state current of the bit-bar driver (1010). Forward biasing the bit-side n-well (1028) during a write high operation may reduce write failures by increasing a transfer function of the potential on the bit data line (1022) to the bit-side data node (1008). Furthermore, forward biasing the bit-bar-side n-well (1030) during a write high operation may also reduce write failures by increasing a transfer function of the potential on the bit-bar data line (1026) to the bit-bar-side data node (1014). During a write high operation, the bit-side n-wells and the bit-bar-side n-wells in half-addressed SRAM cells may be reverse biased to possibly reduce data upsets.

The write high operation continues with turning on the bit passgate (1020) and the bit-bar passgate (1024) by coupling the word line (1032) to a low voltage source such as Vss (for example, by coupling a word line switch (1042) to a word line Vss node (1044)). As a result, a potential substantially equal to Vdd on the bit data line (1022) is transferred to the bit-side data node (1008), plus the potential substantially equal to Vss on the bit-bar data line (1026) is transferred to the bit-bar-side data node (1014).

Figure 2B:
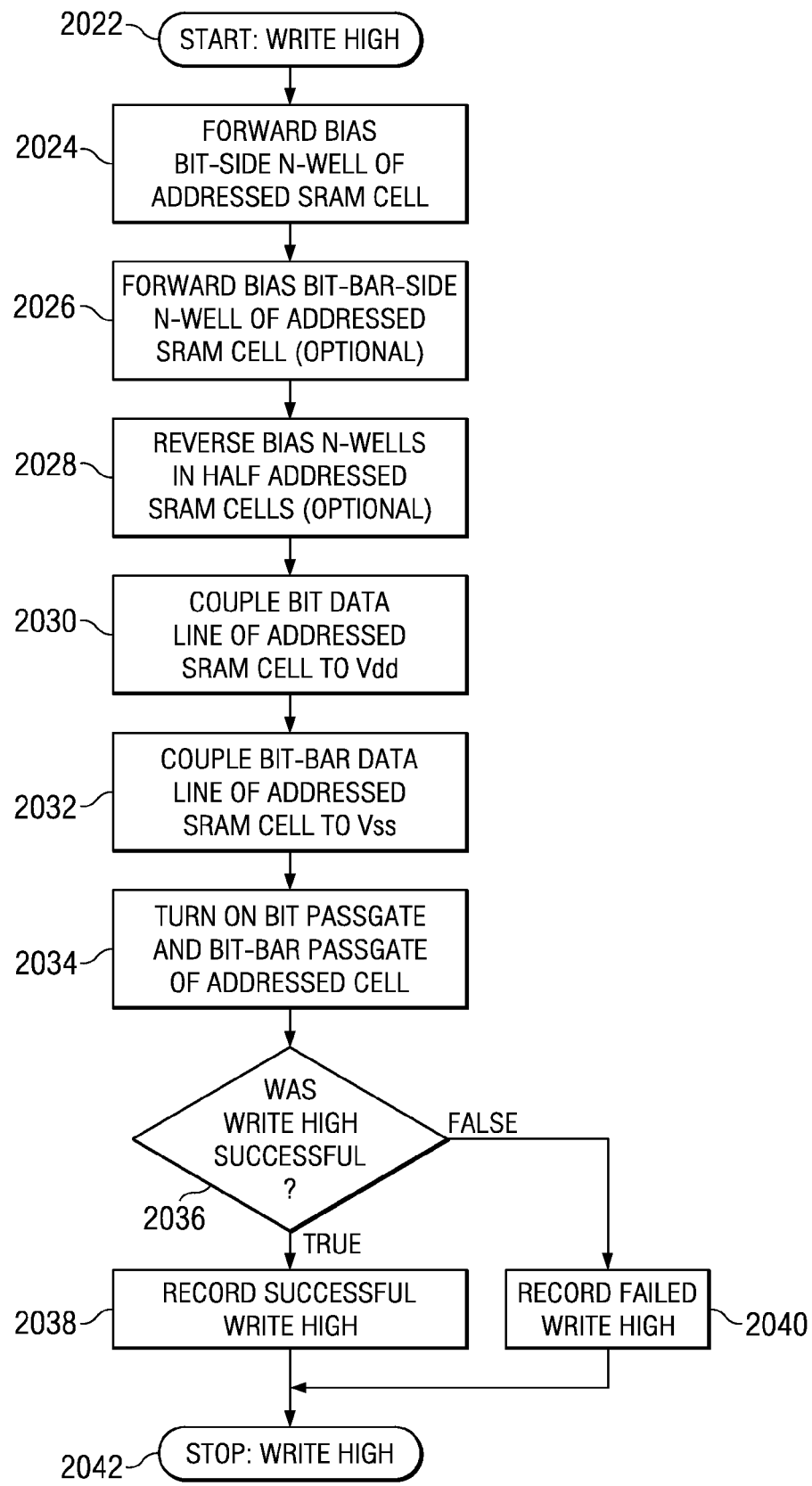

Referring to FIG. 2B, the write high operation begins (2022) with step (2024) that is to forward bias the bit-side n-well (1028) of the addressed SRAM cell (1002). Step (2026) may then be executed, which is to optionally forward bias the bit-bar-side n-well (1030) of the addressed SRAM cell. Then, step (2028) may be executed, which is to optionally reverse bias bit-side n-wells and bit-bar-side n-wells in half-addressed SRAM cells. Next, step (2030) is to couple the bit data line (1022) of the addressed SRAM cell to Vdd (1046). Step (2032) is to couple the bit-bar data line (1026) of the addressed SRAM cell to Vss (1048). Following execution of steps (2030) and (2032), step (2034) is executed, which is to turn on the bit passgate (1020) and the bit-bar passgate (1024) of the addressed SRAM cell.

In embodiments of the write high operation that are part of test operations, following execution of step (2034), step (2036) is determining whether a high voltage was successfully transferred to a bit-side data node (1008) and a low voltage was successfully transferred to a bit-bar-side data node (1014). If the high voltage was successfully transferred to the bit-side data node and the low voltage was successfully transferred to the bit-bar-side data node, step (2038) is to record a successful write high operation for the addressed SRAM cell. Conversely, if the high voltage was not successfully transferred to the bit-side data node or the low voltage was not successfully transferred to the bit-bar-side data node, step (2040) is to record a failed write low operation for the addressed SRAM cell. After step (2038) or step (2040) is executed—or after step (2034) is executed in embodiments which are not part of test operations—the write high operation is ended at step (2042). In other embodiments of the write low operation, steps (2024), (2026), (2028), (2030) and (2032) may be performed in any order.

Referring back to FIG. 1, a read operation may be performed to read a data bit from the SRAM cell (1002). In a read operation, the bit data line (1022) is coupled to a low voltage source such as Vss. For example, the bit data line (1022) may be coupled to the bit data line Vss node (1036) through the bit data line switch (1034) in order to pre-charge the bit data line (1022) to a low voltage. Similarly, the bit-bar data line (1026) is coupled to a low voltage source such as Vss. For example, the bit-bar data line (1026) is coupled to the bit data line Vss node (1048) through the bit-bar data line switch (1038) in order to pre-charge the bit-bar data line (1026) to a low voltage. After the bit data line (1022) is pre-charged, the bit data line (1022) is floated (this is depicted schematically in FIG. 1 by a bit data line floating node (1050)). Similarly, after the bit-bar data line (1026) is pre-charged, the bit-bar data line (1026) is floated (this is depicted schematically in FIG. 1 by a bit-bar data line floating node (1052)).

During the read operation on the SRAM cell (1002), the bit-side n-well (1028) may be reverse biased to possibly decrease the ratio of the on state current of the bit passgate (1020) to the on state current of the bit driver (1004). In addition, the bit-bar-side n-well (1030) may be reverse biased so as to possibly decrease the ratio of the on state current of the bit-bar passgate (1024) to the on state current of the bit-bar driver (1010). Reverse biasing the bit-side n-well (1028) and the bit-bar-side n-well (1030) during a read operation may reduces read failures by providing lower resistance paths between the bit-side data node (1008) and Vdd, and also between the bit-bar-side data node (1014) and Vdd (as compared to the resistance paths between the bit-side data node (1008) and the bit data line (1022), and between the bit-bar-side data node (1014) and the bit-bar data line (1026)). During a read operation the bit-side n-wells and bit-bar-side n-wells in half-addressed SRAM cells may be reverse biased to possibly reduce data upsets.

The read operation continues with turning on the bit passgate (1020) and the bit-bar passgate (1024) by coupling the word line (1032) to a low voltage source such as Vss (for example, by coupling the word line switch (1042) to the word line Vss node (1044)). As a result, a potential on the bit-side data node (1008) is transferred to the bit data line (1022) and a corresponding opposite potential on the bit-bar-side data node (1014) is transferred to the bit-bar data line (1026). This read operation triggers external circuitry (such as a sense amplifier (not shown) coupled to the bit data line (1022) and the bit-bar data line (1026)) such that the data bit is available to other circuitry outside the SRAM cell (1002).

Referring to FIG. 2C, the read operation begins (2044) with step (2046) that is to forward bias the bit-side n-well (1028) of the addressed SRAM cell (1002). Step (2048) is to forward bias the bit-bar-side n-well (1030) of the addressed SRAM cell. Next, step (2050) may be executed, which is to optionally reverse bias bit-side n-wells and bit-bar-side n-wells in half-addressed SRAM cells. Step (2052) is to couple the bit data line (1022) of the addressed SRAM cell to Vss (1036). Then, step (2054) is to couple the bit-bar data line (1026) of the addressed SRAM cell to Vss (1048). In step (2056) the bit data line of the addressed SRAM cell is floated and in step (2058) the bit-bar data line of the addressed SRAM cell is floated. Following execution of step (2056) and (2058), step (2060) is executed, which is to turn on the bit passgate (1028) and the bit-bar passgate (1024) of the addressed SRAM cell.

In embodiments of the read operation that are part of test operations, following execution of step (2060), step (2062) is to determine if a potential on the bit-side data node (1008) and a corresponding opposite potential on the bit-bar side data node (1014) were successfully transferred to the bit data line and the bit-bar data line of the addressed SRAM cell, respectively. If the potential on the bit-side data node was successfully transferred to the bit data line and the corresponding opposite potential on the bit-bar side data node was successfully transferred to the bit-bar data line, step (2064) is to record a successful read operation for the addressed SRAM cell. Conversely, if the potential on the bit-side data node was not successfully transferred to the bit data line or the corresponding opposite potential on the bit-bar side data node was not successfully transferred to the bit-bar data line, step (2066) is to record a failed read operation for the addressed SRAM cell. After step (2064) or step (2066) is executed—or after step (2060) is executed in embodiments which are not part of test operations—the read operation is ended at step (2068). In other embodiments of the read operation, steps (2046), (2048), (2050), (2052) and (2054) may be performed in any order. In yet further embodiments of the read operation, steps (2056) and (2058) may be performed in any order.

Referring back to FIG. 1, the SRAM cell (1002) may be transitioned to a standby mode by turning off the bit passgate (1020) and the bit-bar passgate (1024). This may be accomplished by coupling the word line (1032) to a high voltage source such as Vdd (as depicted schematically in FIG. 1 by coupling the word line switch (1042) to the word line Vdd node (1054)). During the standby mode, the bit-side n-well (1028) and bit-bar-side n-well (1030) may be reverse biased to possibly reduce leakage currents through the bit driver (1004), the bit passgate (1020), the bit-bar driver (1010), and the bit-bar passgate (1024).

Referring to FIG. 2D, the transition to standby mode operation begins (2070) with step (2072) which is to turn off the bit passgate (1020) and bit-bar passgate (1024). The, step (2074) is to reverse bias the bit-side n-well (1028). Next, step (2076) is to reverse bias the bit-bar-side n-well (1030).

In embodiments of the transition to standby mode operation that are part of test operations (such as measurements of leakage currents in SRAM cell arrays) step (2078) is determining whether the transition to standby mode was successful (for example, if the leakage currents were below target values). If the transition to standby mode was successful, step (2080) is to record a successful transition to standby mode operation for the addressed SRAM cell. Conversely, if the transition to standby mode was not successful, step (2082) is to record a failed transition to standby mode operation for the addressed SRAM cell. After step (2080) or step (2082) is executed—or after step (2076) is executed in embodiments which are not part of test operations—the transition to standby mode operation is ended at step (2084). In other embodiments of the transition to standby mode operation, steps (2072), (2074) and (2076) may be performed in any order.

Figure 3:
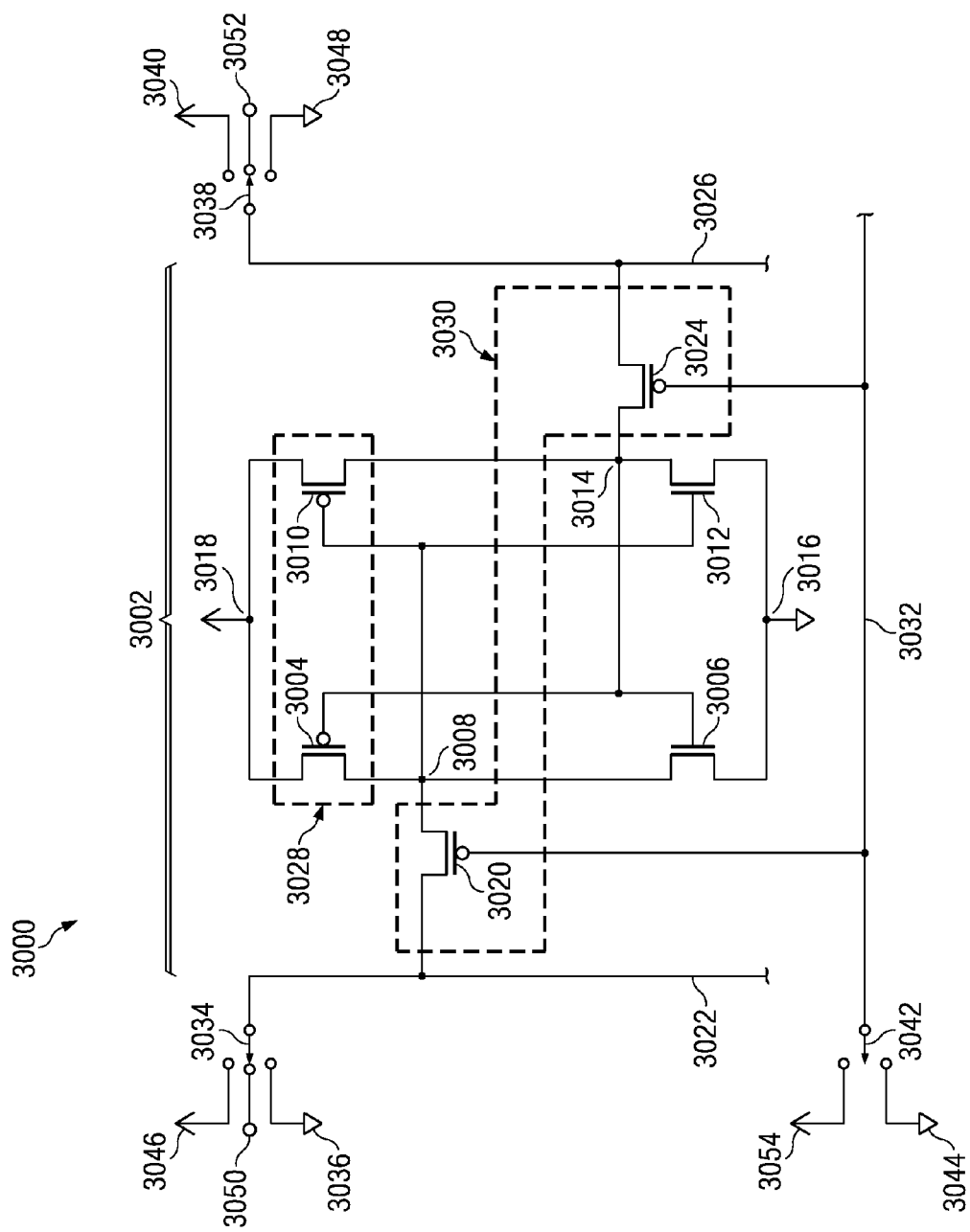
FIG. 3 is a circuit diagram of an SRAM cell in an SRAM cell array contained in an integrated circuit according to the second embodiment of the instant invention.

FIG. 3 is a circuit diagram of an SRAM cell in an SRAM cell array contained in an integrated circuit formed according to the second embodiment. The integrated circuit (3000) contains the SRAM cell (3002) as part of the SRAM cell array. The SRAM cell (3002) includes a bit driver (3004) and a bit load (3006). A drain node of the bit driver (3004) and a drain node of the bit load (3006) are connected to a bit-side data node (3008). The SRAM cell (3002) also includes a bit-bar driver (3010) and bit-bar load (3012). A drain node of the bit-bar driver (3010) and a drain node of the bit-bar load (3012) are connected to a bit-bar-side data node (3014). A source node of the bit load (3006) and a source node of the bit-bar load (3012) are connected to a Vss node (3016). A source node of the bit driver (3004) and a source node of the bit-bar driver (3010) are connected to a Vdd node (3018). A gate node of the bit driver (3004) and a gate node of the bit load (3006) are connected to the bit-bar-side data node (3014). Similarly, a gate node of the bit-bar driver (3010) and a gate node of the bit-bar load (3012) are connected to the bit-side data node (3008).

The SRAM cell (3002) also includes a PMOS bit passgate (3020). A first source/drain node of the bit passgate (3020) is connected to the bit-side data node (3008) and a second source/drain node of the bit passgate (3020) is connected to a bit data line (3022). The SRAM cell (3002) further includes a PMOS bit-bar passgate (3024). A source/drain node of the bit-bar passgate (3024) is connected to the bit-bar-side data node (3014) and a second source/drain node of the bit-bar passgate (3024) is connected to a bit-bar data line (3026).

The integrated circuit (3000) is formed on a p-type substrate. The bit driver (3004) and bit-bar driver (3010) are contained in a driver n-well (3028). The bit passgate (3020) and bit-bar passgate (3024) are contained in a passgate n-well (3030). The driver n-well (3028) and passgate n-well (3030) are formed in the p-type substrate of the integrated circuit, as described supra in reference to elements (1028) and (1030) of FIG. 1. In a preferred embodiment, the driver n-well (3028) is electrically connected within the integrated circuit (3000) to driver n-wells in other SRAM cells (not shown) in a same column as the SRAM cell (3002). Similarly, the passgate n-well (3030) is preferably electrically connected to passgate n-wells in other SRAM cells (not shown) in the same column as the SRAM cell (3002).

In another preferred embodiment, an average on-state current of the bit passgate (3020) is between 60 percent and 80 percent of an average on-state current of the bit driver (3004) (when the driver n-well (3028) is biased at Vdd, the source nodes of the bit passgate (3020) and bit driver (3004) are biased at Vdd, and the drain nodes of the bit passgate (3020) and bit driver (3004) are biased at Vss). Similarly, an average on-state current of the bit-bar passgate (3024) is between 60 percent and 80 percent of an average on-state current of the bit-bar driver (3010) (when the passgate n-well (3030) is biased at Vdd, the source nodes of the bit-bar passgate (3024) and bit-bar driver (3010) are biased at Vdd, and the drain nodes of the bit-bar passgate (3024) and bit-bar driver (3010) are biased at Vss).

A gate node of the bit passgate (3020) and a gate node of the bit-bar passgate (3024) are connected to a word line (3032). It is common for the bit data line (3022) and the bit-bar data line (3026) to also be connected to passgates in other SRAM cells in the same column as the SRAM cell (3002). Furthermore, it is common for the word line (3032) to also be connected to passgates in other SRAM cells in a same row as the SRAM cell (3002).

A write low operation may be performed on the SRAM cell (3002) that results in a low voltage on the bit-side data node (3008). In a write low operation, the bit data line (3022) is coupled to a low voltage source such as Vss. For example, the bit data line (3022) may be coupled to a bit data line Vss node (3036) through a bit data line switch (3034), as depicted in FIG. 3. In addition, the bit-bar data line (3026) is coupled to a high voltage source such as Vdd. For example, the bit-bar data line (3026) may be coupled to a bit-bar data line Vdd node (3040) through a bit-bar data line switch (3038), as depicted in FIG. 3.

During the write low operation on the SRAM cell (3002), the driver n-well (3028) is reverse biased and the passgate n-well (3030) is forward biased. This may increase a ratio of the on state current of the bit passgate (3020) to the on state current of the bit driver (3004). This may increase a ratio of the on state current of the bit-bar passgate (3024) to the on state current of the bit-bar driver (3010). Reverse biasing the driver n-well (3028) and forward biasing the passgate n-well (3030) during a write low operation may reduce write failures by increasing a transfer function of the potential on the bit data line (3022) to the bit-side data node (3008), and also increasing a transfer function of the potential on the bit-bar data line (3026) to the bit-bar-side data node (3014).

The write low operation continues with turning on the bit passgate (3020) and the bit-bar passgate (3024) with coupling the word line (3032) to a low voltage source such as Vss. Specifically, the word line (3032) may be coupled to a word line Vss node (3044) through word line switch (3042), as depicted in FIG. 3. As a result, the potential substantially equal to Vss on the bit data line (3022) is transferred to the bit-side data node (3008). Plus, the potential substantially equal to Vdd on the bit-bar data line (3026) is transferred to the bit-bar-side data node (3014).

During a write low operation, driver n-wells in half-addressed SRAM cells may be forward biased and passgate n-wells in half-addressed SRAM cells may be reverse biased. Doing so may decrease the ratios of on state currents of the passgate transistors to on state currents of driver transistors in half-addressed SRAM cells. In addition, data upsets may be reduced in the half addressed SRAM cells by providing lower resistance paths from the bit-side data nodes to Vss and Vdd in the half addressed SRAM cells.

Figure 4A:
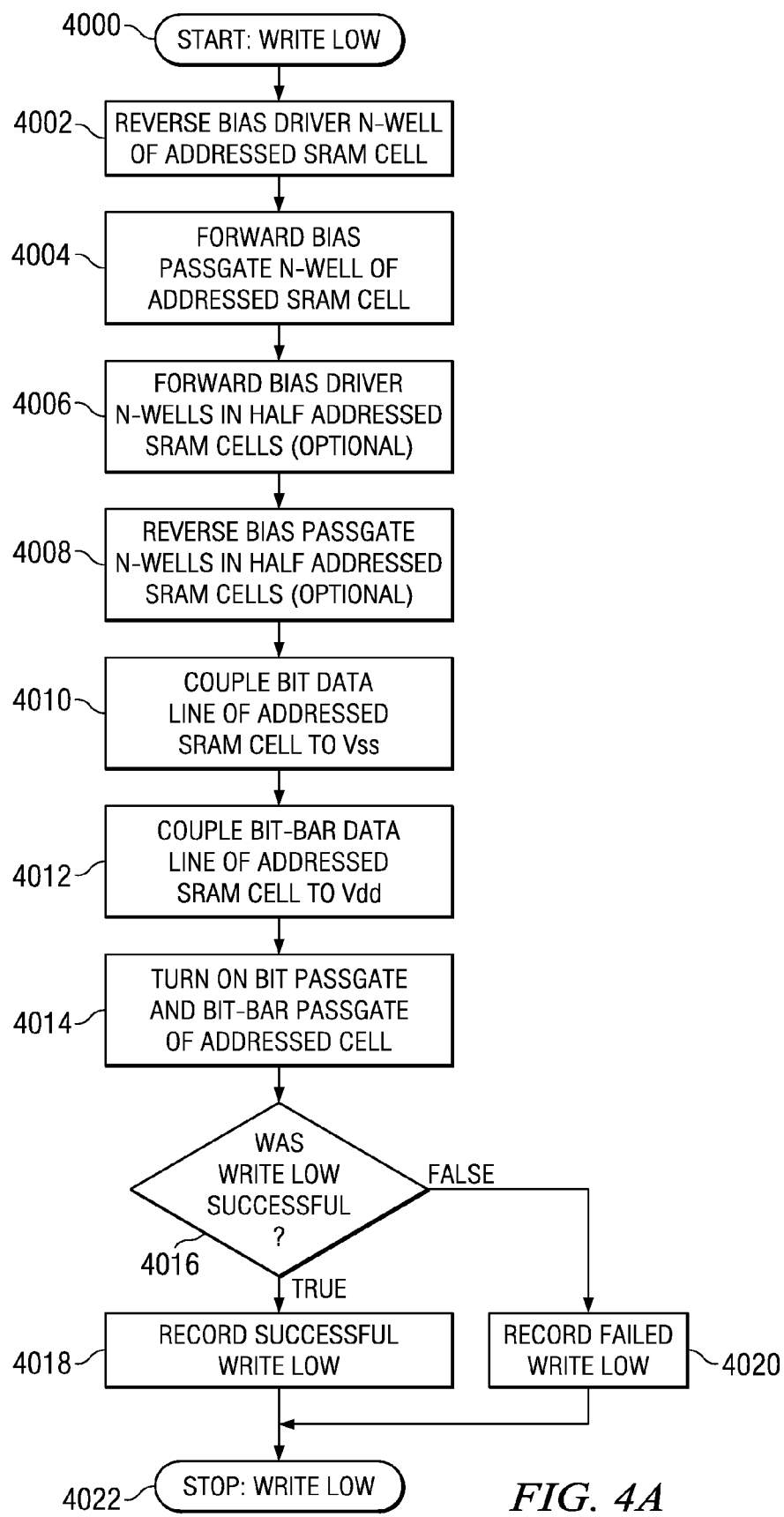

FIG. 4A through FIG. 4D are flowcharts of a write low operation, a write high operation, a read operation, and a transition to standby mode operation, respectively. The flowcharts in FIG. 4A through FIG. 4D refer to an addressed SRAM cell, such as the addressed SRAM cell (3002) depicted in FIG. 3. Referring to FIG. 4A, the write low operation begins (4000) with step (4002) that is to reverse bias a driver n-well (3028) of the addressed SRAM cell (3002). Step (4004) is to forward bias a passgate n-well (3030) of the addressed SRAM cell. Then, step (4006) may be executed, which is to optionally forward bias driver n-wells in half-addressed SRAM cells. Next, step (4008) may be executed, which is to optionally reverse bias passgate n-wells in half-addressed SRAM cells. Step (4010) is to couple a bit data line (3022) of the addressed SRAM cell to Vss (3036). Then, in step (4012) a bit-bar data line (3026) of the addressed SRAM cell is coupled to Vdd (3040). Following the execution of steps (4010) and (4012), step (4014) is to turn on a bit passgate (3020) and a bit-bar passgate (3024) of the addressed SRAM cell.

In embodiments of the write low operation that are part of test operations, following execution of step (4014), step (4016) is determining whether a low voltage was successfully transferred to a bit-side data node (3008) and a high voltage was successfully transferred to a bit-bar-side data node (3014). If the low voltage was successfully transferred to the bit-side data node and the high voltage was successfully transferred to the bit-bar-side data node, then step (4018) is to record a successful write low operation for the addressed SRAM cell. Conversely, if the low voltage was not successfully transferred to the bit-side data node or the high voltage was not successfully transferred to the bit-bar-side data node, then step (4020) is to record a failed write low operation for the addressed SRAM cell. After step (4018) or step (4020) is executed—or after step (4014) is executed in embodiments which are not part of test operations—the write low operation is ended at step (4022). In other embodiments of the write low operation, steps (4002), (4004), (4006), (4008), (4010) and (4012) may be performed in any order.

Referring back to FIG. 3, a write high operation may be performed on the SRAM cell (3002) that results in a high voltage on the bit-side data node (3008). In a write high operation, the bit data line (3022) is coupled to a high voltage source such as Vdd. For example, the bit data line (3022) may be coupled to the bit data line Vdd node (3046) through the bit data line switch (3034). The bit-bar data line (3026) is coupled to a low voltage source such as Vss. For example, the bit-bar data line (3026) may be coupled to the bit-bar data line Vss node (3048) through the bit-bar data line switch (3038).

During the write high operation on the SRAM cell (3002), the driver n-well (3028) is reverse biased and the passgate n-well (3030) is forward biased, to possibly increase a ratio of the on state current of the bit passgate (3020) to the on state current of the bit driver (3004), and also to possibly increase a ratio of the on state current of the bit-bar passgate (3024) to the on state current of the bit-bar driver (3010). Reverse biasing the driver n-well (3028) and forward biasing the passgate n-well (3030) during a write high operation may reduce write failures by increasing a transfer function of the potential on the bit data line (3022) to the bit-side data node (3008) and increasing a transfer function of the potential on the bit-bar data line (3026) to the bit-bar-side data node (3014). During a write high operation, the driver n-wells in half-addressed SRAM cells may be forward biased and the passgate n-wells in half-addressed SRAM cells may be reverse biased to possibly reduce data upsets.

The write high operation continues with turning on the bit passgate (3020) and the bit-bar passgate (3024) by coupling the word line (3032) to a low voltage source such as Vss. For example, the word line (3032) may be coupled to the word line Vss node (3044) through the word line switch (3042). As a result, the potential substantially equal to Vdd on the bit data line (3022) is transferred to the bit-side data node (3008). Plus, the potential substantially equal to Vss on the bit-bar data line (3026) is transferred to the bit-bar-side data node (3014).

Figure 4B:
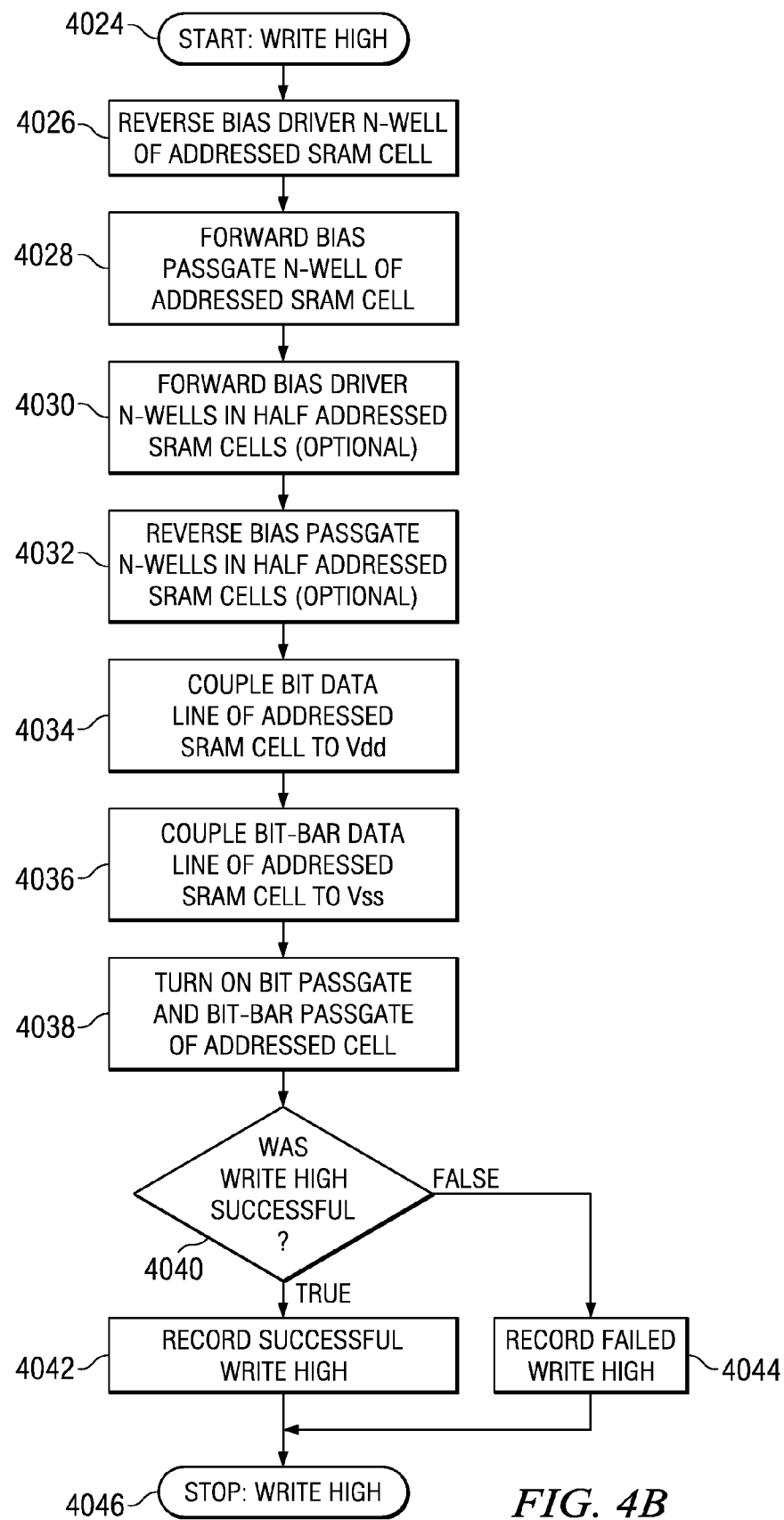

Referring to FIG. 4B, the write high operation begins (4024) with step (4026) that is to reverse bias the driver n-well (3028) of the addressed SRAM cell (3002). Step (4028) is forward bias the passgate n-well (3030) of the addressed SRAM cell. Then, step (4030) may be executed, which is to optionally forward bias driver n-wells in half-addressed SRAM cells. Next, step (4032) may be executed, which is to optionally reverse bias passgate n-wells in half-addressed SRAM cells. Step (4034) is to couple the bit data line (3022) of the addressed SRAM cell to Vdd (3046). In addition, step (4036) is to couple the bit-bar data line (3025) of the addressed SRAM cell to Vss (3048). Following execution of steps (4034) and (4036), step (4038) is to turn on the bit passgate (3020) and the bit-bar passgate (3024) of the addressed SRAM cell.

In embodiments of the write high operation that are part of test operations, following execution of step (4038), step (4040) is determining whether a high voltage was successfully transferred to a bit-side data node (3008) and a low voltage was successfully transferred to a bit-bar-side data node (3014). If the high voltage was successfully transferred to the bit-side data node and the low voltage was successfully transferred to the bit-bar-side data node, then step (4042) is to record a successful write high operation for the addressed SRAM cell. Conversely, if the high voltage was not successfully transferred to the bit-side data node or the low voltage was not successfully transferred to the bit-bar-side data node, then step (4044) is to record a failed write low operation for the addressed SRAM cell. After step (4042) or step (4044) is executed—or after step (4038) is executed in embodiments which are not part of test operations—the write high operation is ended at step (4046). In other embodiments of the write low operation, steps (4026), (4028), (4030), (4034) and (4036) may be performed in any order.

Referring back to FIG. 3, a read operation may be performed to read a data bit from the SRAM cell (3002). In a read operation, the bit data line (3022) is coupled to a low voltage source such as Vss. For example, the bit data line (3022) may be coupled to the bit data line Vss node (3036) through the bit data line switch (3034) in order to pre-charge the bit data line (3022) to a low voltage. In addition, the bit-bar data line (3026) is coupled to a low voltage source such as Vss. For example, the bit-bar data line (3026) is coupled to the bit data line Vss node (3048) through the bit-bar data line switch (3038) in order to pre-charge the bit-bar data line (3026) to a low voltage. After the bit data line (3022) is pre-charged, the bit data line (3022) is floated (as depicted schematically in FIG. 3 by the bit data line switch (3034) coupled to a bit data line floating node (3050)). Similarly, after the bit-bar data line (3026) is pre-charged, the bit-bar data line (3026) is floated (as depicted schematically in FIG. 3 by the bit-bar data line switch (3038) coupled to a bit-bar data line floating node (3052)).

During the read operation on the SRAM cell (3002), the driver n-well (3028) is forward biased and the passgate n-well (3030) is reverse biased to possibly decrease the ratio of the on state current of the bit passgate (3020) to the on state current of the bit driver (3004), and also to possibly decrease the ratio of the on state current of the bit-bar passgate (3024) to the on state current of the bit-bar driver (3010). Forward biasing the driver n-well (3028) and reverse biasing the passgate n-well (3030) during a read operation may reduce read failures by providing lower resistance paths between the bit-side data node (3008) and Vdd, and also between the bit-bar-side data node (3014) and Vdd (compared to resistance paths between the bit-side data node (3008) and the bit data line (3022), and also between the bit-bar-side data node (3014) and the bit-bar data line (3026)). During a read operation, the driver n-wells in half-addressed SRAM cells may be forward biased and the passgate n-wells in half-addressed SRAM cells may be reverse biased to possibly reduce data upsets.

The read operation continues with turning on the bit passgate (3020) and the bit-bar passgate (3024) by coupling the word line (3032) to a low voltage source such as Vss. Specifically, the word line (3032) may be coupled to a word line Vss node (3044) through the word line switch (3042). As a result, a potential on the bit-side data node (3008) is transferred to the bit data line (3022) and a corresponding opposite potential on the bit-bar-side data node (3014) is transferred to the bit-bar data line (3026). This triggers external circuitry (such as a sense amplifier) coupled to the bit data line (3022) and the bit-bar data line (3026) to provide the data bit to other circuitry (not shown) outside the SRAM cell.

Referring to FIG. 4C, the read operation begins (4048) with step (4050) that is to forward bias the driver n-well (3028) of the addressed SRAM cell. Step (4052) is to reverse bias the passgate n-well (3030) of the addressed SRAM cell. Then, step (4054) may be executed, which is to optionally forward bias driver n-wells in half-addressed SRAM cells. Next, step (4056) may be executed, which is to optionally reverse bias passgate n-wells in half-addressed SRAM cells. Step (4058) is to couple the bit data line (3022) of the addressed SRAM cell to Vss (3036). Then, step (4060) is to couple the bit-bar data line (3026) of the addressed SRAM cell to Vss (3036). Next, step (4062) is to float the bit data line of the addressed SRAM cell and step (4064) is to float the bit-bar data line of the addressed SRAM cell. Following execution of step (4062) and (4064), step (4066) is to turn on a bit passgate (3020) and a bit-bar passgate (3024) of the addressed SRAM cell.

In embodiments of the read operation that are part of test operations, following execution of step (4066), step (4068) is determining whether a potential on the bit-side data node and a corresponding opposite potential on the bit-bar side data node were successfully transferred to the bit data line and the bit-bar data line of the addressed SRAM cell, respectively. If the potential on the bit-side data node was successfully transferred to the bit data line and the corresponding opposite potential on the bit-bar side data node was successfully transferred to the bit-bar data line, then step (4070) is to record a successful read operation for the addressed SRAM cell. Conversely, if the potential on the bit-side data node was not successfully transferred to the bit data line or the corresponding opposite potential on the bit-bar side data node was not successfully transferred to the bit-bar data line, then step (4072) is to record a failed read operation for the addressed SRAM cell. After step (4070) or step (4072) is executed—or after step (4066) is executed in embodiments which are not part of test operations—the read operation is ended at step (4074). In other embodiments of the read operation, steps (4050), (4052), (4054), (4058) and (4060) may be performed in any order. In yet further embodiments of the read operation, steps (4062) and (4064) may be performed in any order.

Referring back to FIG. 3, the SRAM cell (3002) may be transitioned to a standby mode by turning off the bit passgate (3020) and the bit-bar passgate (3024). This is accomplished by connecting the word line (3032) to a high voltage source such as Vdd. For example, the word line (3032) may be coupled to a word line Vdd node (3054) through word line switch (3042). During the standby mode, the driver n-well (3028) and passgate n-well (3030) are reverse biased to possibly reduce leakage currents through the bit driver (3004), the bit passgate (3020), the bit-bar driver (3010), and the bit-bar passgate (3024).

Referring to FIG. 4D, the transition to standby mode operation begins (4076) with step (4078) that is to turn off the bit passgate (3020) and bit-bar passgate (3024). Step (4080) is to reverse bias the driver n-well (3028). Then, step (4082) is to reverse bias the passgate n-well (3030).

In embodiments of the transition to standby mode operation that are part of test operations (such as measurements of leakage currents in SRAM cell arrays) step (4084) is determining whether the transition to standby mode was successful (for example, whether the leakage currents were below target values). If the transition to standby mode was successful, then step (4086) is to record a successful transition to standby mode operation for the addressed SRAM cell. Conversely, if the transition to standby mode was not successful, then step (4088) is o record a failed transition to standby mode operation for the addressed SRAM cell. After step (4086) or step (4088) is executed—or after step (4082) is executed in embodiments which are not part of test operations—the transition to standby mode operation is ended at step (4090). In other embodiments of the transition to standby mode operation, steps (4078), (4080) and (4082) may be performed in any order.

Figure 5:
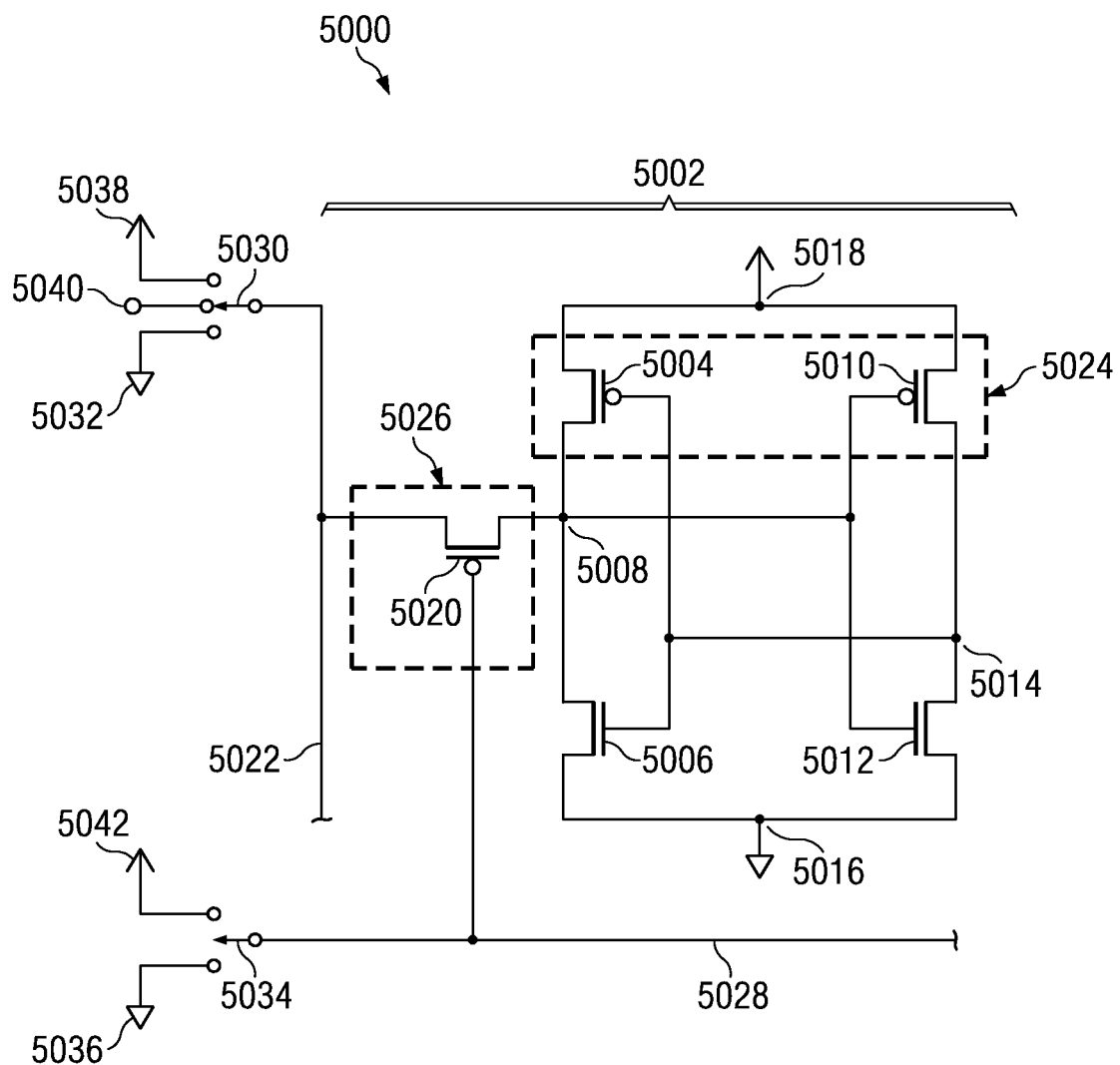
FIG. 5 is a circuit diagram of an SRAM cell in an SRAM cell array contained in an integrated circuit according to the third embodiment of the instant invention.

FIG. 5 is a circuit diagram of an SRAM cell in an SRAM cell array contained in an integrated circuit formed according to the third embodiment of the instant invention. The integrated circuit (5000) contains the SRAM cell (5002) as part of the SRAM cell array. The SRAM cell (5002) includes a bit driver (5004) and a bit load (5006). A drain node of the bit driver (5004) and a drain node of the bit load (5006) are connected to a bit-side data node (5008). The SRAM cell (5002) also includes a bit-bar driver (5010) and bit-bar load (5012). A drain node of the bit-bar driver (5010) and a drain node of the bit-bar load (5012) are connected to a bit-bar-side data node (5014). A source node of the bit load (5006) and a source node of the bit-bar load (5012) are connected to a Vss node (5016). A source node of the bit driver (5004) and a source node of the bit-bar driver (5010) are connected to a Vdd node (5018). A gate node of the bit driver (5004) and a gate node of the bit load (5006) are connected to the bit-barside data node (5014). Similarly, a gate node of the bit-bar driver (5010) and a gate node of the bit-bar load (5012) are connected to the bit-side data node (5008). The SRAM cell (5002) also includes a PMOS bit passgate (5020). A first source/drain node of the bit passgate (5020) is connected to the bit-side data node (5008) and a second source/drain node of the bit passgate (5020) is connected to a bit data line (5022).

The integrated circuit (5000) is formed on a p-type substrate. The bit driver (5004) and bit-bar driver (5010) are contained in a driver n-well (5024). The bit passgate (5020) is contained in a passgate n-well (5026). The driver n-well (5024) and passgate n-well (5026) are formed in the p-type substrate of the integrated circuit, as described supra in reference to elements (1028) and (1030) of FIG. 1. In a preferred embodiment, the driver n-well (5024) is electrically connected to driver n-wells in other SRAM cells in a same column as the SRAM cell (5002). Similarly, the passgate n-well (5026) is preferably electrically connected to passgate n-wells in other SRAM cells in the same column as the SRAM cell (5002). In a preferred embodiment, an average on-state current of the bit passgate (5020) is between 60 percent and 80 percent of an average on-state current of the bit driver (5004) (specifically, when the driver n-well (5024) is biased at Vdd, the source nodes of the bit passgate (5020) and bit driver (5004) are biased at Vdd, and the drain nodes of the bit passgate (5020) and bit driver (5004) are biased at Vss).

A gate node of the bit passgate (5020) is connected to a word line (5028). It is common for the bit data line (5022) to be connected to passgates in other SRAM cells in the same column as the SRAM cell (5002). Furthermore, it is common for the word line (5028) to be connected to passgates in other SRAM cells in a same row as the SRAM cell (5002).

A write low operation may be performed on the SRAM cell (5002) that results in a low voltage on the bit-side data node (5008). In a write low operation, the bit data line (5022) is coupled to a low voltage source such as Vss. For example, the bit data line (5022) may be coupled to a bit data line Vss node (5032) through a bit data line switch (5030), as depicted in FIG. 5. During the write low operation on the SRAM cell (5002), the driver n-well (5024) is reverse biased and the passgate n-well (5026) is forward biased. This may increase a ratio of the on state current of the bit passgate (5020) to the on state current of the bit driver (5004). Furthermore, reverse biasing the driver n-well (5024) and forward biasing the passgate n-well (5026) during a write low operation may reduce write failures by increasing a transfer function of the potential on the bit data line (5022) to the bit-side data node (5008).

The write low operation continues with turning on the bit passgate (5020) with coupling the word line (5028) to a low voltage source such as Vss. For example, a word line switch (5034) may couple the word line (5028) to a word line Vss node (5036), as depicted in FIG. 5. As a result, the potential substantially equal to Vss on the bit data line (5022) is transferred to the bit-side data node (5008).

During a write low operation, the driver n-wells in half-addressed SRAM cells may be forward biased and the passgate n-wells in half-addressed SRAM cells may be reverse biased. Doing so may decrease ratios of on state currents of the passgate transistors to on state currents of driver transistors in half-addressed SRAM cells. This may reduce data upsets in the half addressed SRAM cells by providing lower resistance paths from the bit-side data nodes to Vss and Vdd in the half addressed SRAM cells.

Figure 6A:
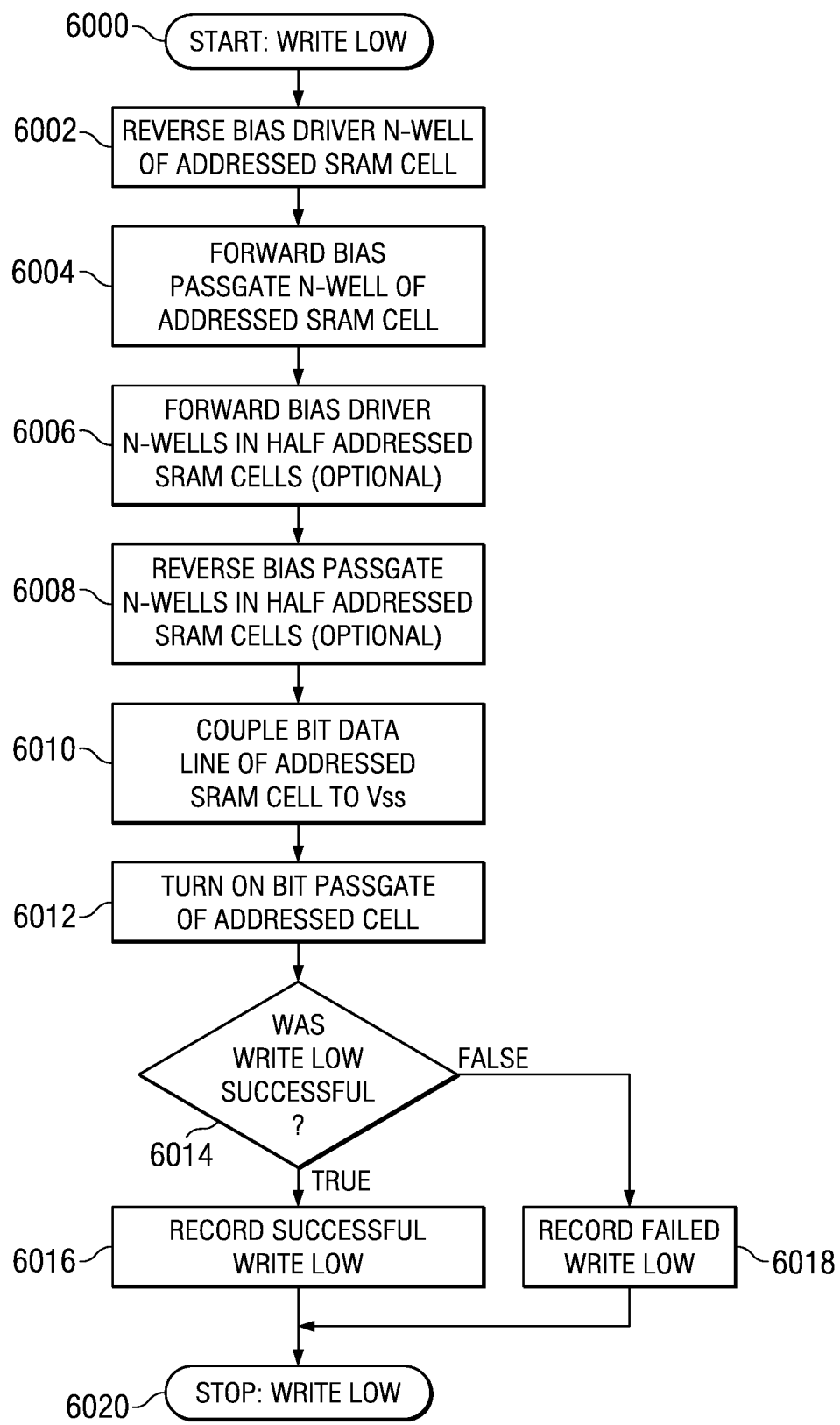

FIG. 6A through FIG. 6D are flowcharts of a write low operation, a write high operation, a read operation, and a transition to standby mode operation, respectively. The flowcharts in FIG. 6A through FIG. 6D refer to an example addressed SRAM cell, such as the SRAM cell (5002) depicted in FIG. 5. Referring to FIG. 6A, the write low operation begins (6000) with step (6002) that is to reverse bias a driver n-well (5024) of the addressed SRAM cell (5002). Step (6004) is to forward bias a passgate n-well (5026) of the addressed SRAM cell. Then, step (6006) may be executed, which is to optionally forward bias driver n-wells in half-addressed SRAM cells. Then, step (6008) may be executed, which is to optionally reverse bias passgate n-wells in half-addressed SRAM cells. Step (6010) is to couple a bit data line (5022) of the addressed SRAM cell to Vss (5032). Following step (6010), step (6012) is to turn on a bit passgate (5020) of the addressed SRAM cell.

In embodiments of the write low operation that are part of test operations, following execution of step (6012), step (6014) is determining whether a low voltage was successfully transferred to a bit-side data node (5008). If the low voltage was successfully transferred to the bit-side data node, step (6016) is to record a successful write low operation for the addressed SRAM cell. Conversely, if the low voltage was not successfully transferred to the bit-side data node, then step (6018) is to record a failed write low operation for the addressed SRAM cell. After step (6016) or step (6018) is executed—or after step (6012) is executed in embodiments which are not part of test operations—the write low operation is ended at step (6020). In other embodiments of the write low operation, steps (6002), (6004), (6006), (6008) and (6010) may be performed in any order.

Referring back to FIG. 5, a write high operation may be performed on the SRAM cell (5002) that results in a high voltage on the bit-side data node (5008). In a write high operation, the bit data line (5022) is coupled to a high voltage source such as Vdd. For example, the bit data line (5022) may be coupled to a bit data line Vdd node (5038) through the bit data line switch (5030). During the write high operation on the SRAM cell (5002), the driver n-well (5024) is reverse biased and the passgate n-well (5026) is forward biased to possibly increase a ratio of the on state current of the bit passgate (5020) to the on state current of the bit driver (5004). Reverse biasing the driver n-well (5024) and forward biasing the passgate n-well (5026) during a write high operation may reduce write failures by increasing a transfer function of the potential on the bit data line (5022) to the bit-side data node (5008). Also during a write high operation, the driver n-wells in half-addressed SRAM cells may be forward biased and the passgate n-wells in half-addressed SRAM cells may be reverse biased to possibly reduce data upsets.

The write high operation continues with turning on the bit passgate (5020) with coupling the word line (5028) to a low voltage source such as Vss. For example, the word line (5028) may be coupled to a word line Vss node (5036) through a word line switch (5034). As a result, the potential substantially equal to Vdd on the bit data line (5022) is transferred to the bit-side data node (5008).

Figure 6B:
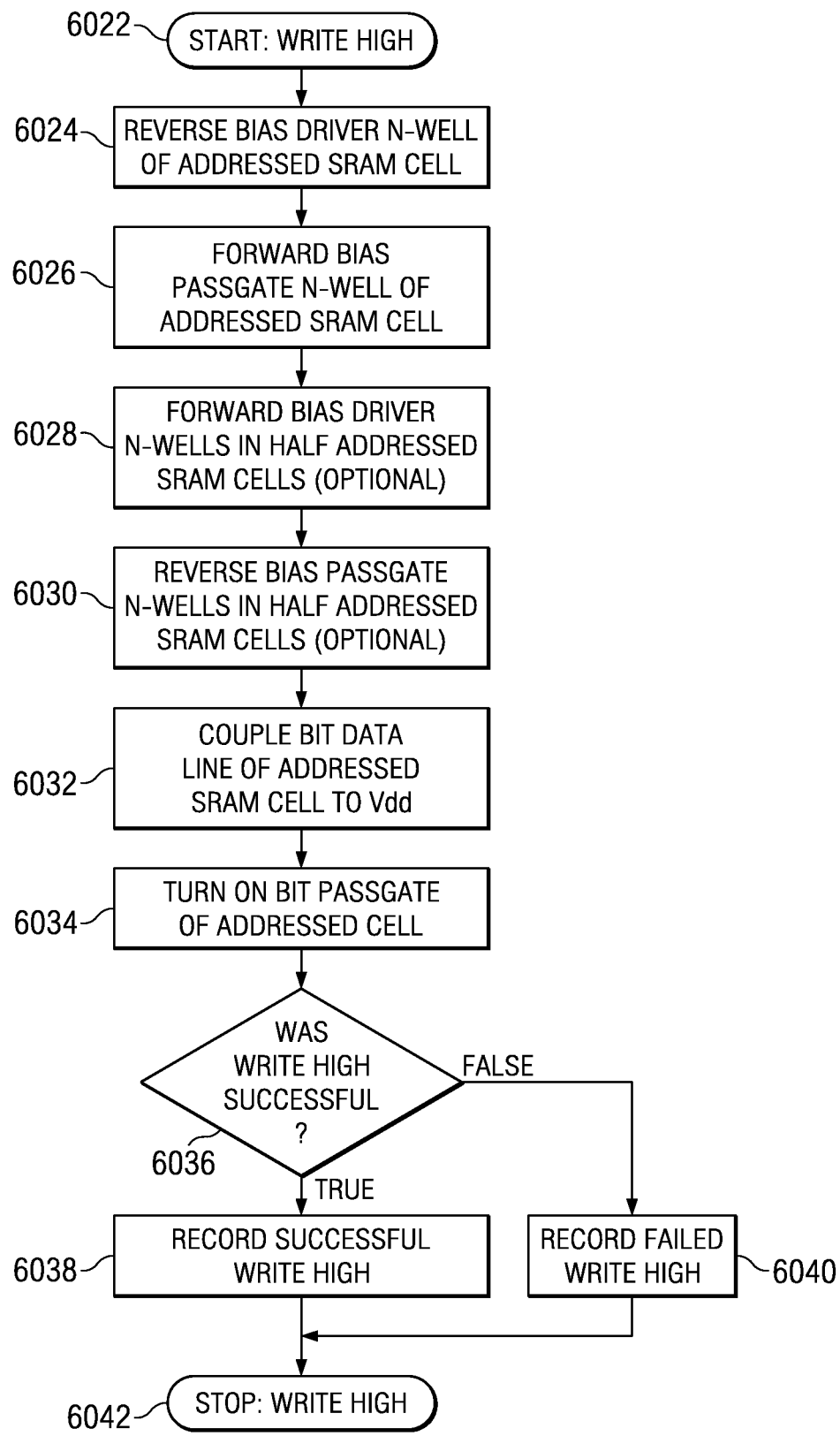

Referring to FIG. 6B, the write high operation begins (6022) with step (6024) that is to reverse bias the driver n-well (5024) of the addressed SRAM cell (5002). Step (6026) is to forward bias the passgate n-well (5026) of the addressed SRAM cell. Then, step (6028) may be executed, which is to optionally forward bias driver n-wells in half-addressed SRAM cells of the integrated circuit. Next, step (6030) may be executed, which is to optionally reverse bias passgate n-wells in half-addressed SRAM cells of the integrated circuit. Step (6032) is to couple the bit data line of the addressed SRAM cell to Vdd (5038). Following execution of step (6032), step (6034) is to turn on the bit passgate (5020) of the addressed SRAM cell.

In embodiments of the write high operation that are part of test operations, following execution of step (6034), step (6036) is determining whether a high voltage was successfully transferred to a bit-side data node (5008). If the high voltage was successfully transferred to the bit-side data node, step (6038) is to record a successful write high operation for the addressed SRAM cell. Conversely, if the high voltage was not successfully transferred to the bit-side data node, then step (6040) is to record a failed write low operation for the addressed SRAM cell. After step (6038) or step (6040) is executed—or after step (6034) is executed in embodiments which are not part of test operations—the write high operation is ended at step (6042). In other embodiments of the write low operation, steps (6024), (6026), (6028) and (6032) may be performed in any order.

Referring back to FIG. 5, a read operation may be performed to read a data bit from the SRAM cell (5002). In a read operation, the bit data line (5022) is coupled to a low voltage source such as Vss. For example, the bit data line (5022) is coupled to the bit data line Vss node (5032) through the bit data line switch (5030) in order to pre-charge the bit data line (5022) to a low voltage. After the bit data line (5022) is pre-charged, the bit data line (5022) is floated (as schematically depicted in FIG. 5 by a bit data line floating node (5040)). During the read operation on the SRAM cell (5002), the driver n-well (5024) is forward biased and the passgate n-well (5026) is reverse biased to possibly decrease the ratio of the on state current of the bit passgate (5020) to the on state current of the bit driver (5004). Forward biasing the driver n-well (5024) and reverse biasing the passgate n-well (5026) during a read operation may reduce read failures by providing a lower resistance path between the bit-side data node (5008) and Vdd (as compared to the resistance path between the bit-side data node (5008) and the bit data line (5022)). Also during a read operation, the driver n-wells in half-addressed SRAM cells may be forward biased and the passgate n-wells in half-addressed SRAM cells may be reverse biased to possibly reduce data upsets.

The read operation continues with turning on the bit passgate (5020) by coupling the word line (5028) to a low voltage source such as Vss. For example, the word line (5028) is coupled to a word line Vss node (5036) with a word line switch (5034). As a result, a potential on the bit-side data node (5008) is transferred to the bit data line (5022). This in turn triggers external circuitry (such as a sense amplifier) coupled to the bit data line (5022) to make the data bit available to other circuitry outside the SRAM cell array.

Referring to FIG. 6C, the read operation begins (6044) with step (6046) that is to forward bias the driver n-well (5024) of the addressed SRAM cell (5002). Step (6048) is to reverse bias the passgate n-well (5026) of the addressed SRAM cell. Next, step (6050) may be executed, which is to optionally forward bias the driver n-wells in half-addressed SRAM cells. Then, step (6052) may be executed, which is to optionally reverse bias the passgate n-wells in half-addressed SRAM cells. Step (6054) is to couple the bit data line (5022) of the addressed SRAM cell to Vss (5032). Next, step (6056) is to float the bit data line of the addressed SRAM cell. Following execution of step (6056), step (6058) is to turn on a bit passgate (5020) of the addressed SRAM cell.

In embodiments of the read operation that are part of test operations, following execution of step (6058), step (6060) is executed, which is determining whether a potential on the bit-side data node (5008) was successfully transferred to the bit data line (5022). If the potential on the bit-side data node was successfully transferred to the bit data line, step (6062) is to record a successful read operation for the addressed SRAM cell. Conversely, if the potential on the bit-side data node was not successfully transferred to the bit data line, then step (6064) is to record a failed read operation for the addressed SRAM cell. After step (6062) or step (6064) is executed—or after step (6058) is executed in embodiments which are not part of test operations—the read operation is ended at step (6066). In other embodiments of the read operation, steps (6046), (6048), (6050) and (6054) may be performed in any order.

Referring back to FIG. 5, the SRAM cell (5002) may be transitioned to a standby mode by turning off the bit passgate (5020). This is accomplished by coupling the word line (5028) to a high voltage source such as Vdd (this is depicted schematically in FIG. 5 by a word line switch (5034) coupling the word line (5028) to a word line Vdd node (5042)). During the standby mode, the driver n-well (5024) and the passgate n-well (5026) are reverse biased to possibly reduce leakage currents through the bit driver (5004) and the bit passgate (5020).

Referring to FIG. 6D, the transition to standby mode operation begins (6068) with step (6070) that is to turn off the bit passgate (5020). Step (6072) is to reverse bias the driver n-well (5024). Then, step (6074) is to reverse bias the passgate n-well (5026). In embodiments of the transition to standby mode operation that are part of test operations (such as measurements of leakage currents in SRAM cell arrays) step (6076) is determining whether the transition to standby mode was successful (for example, whether leakage currents were below target values). If the transition to standby mode was successful, step (6078) is to record a successful transition to standby mode operation for the addressed SRAM cell. Conversely, if the transition to standby mode was not successful, then step (6080) is to record a failed transition to standby mode operation for the addressed SRAM cell. After step (6078) or step (6080) is executed—or after step (6074) is executed in embodiments which are not part of test operations—the transition to standby mode operation is ended at step (6082). In other embodiments of the transition to standby mode operation, steps (6070), (6072) and (6074) may be performed in any order.

Figure 7:
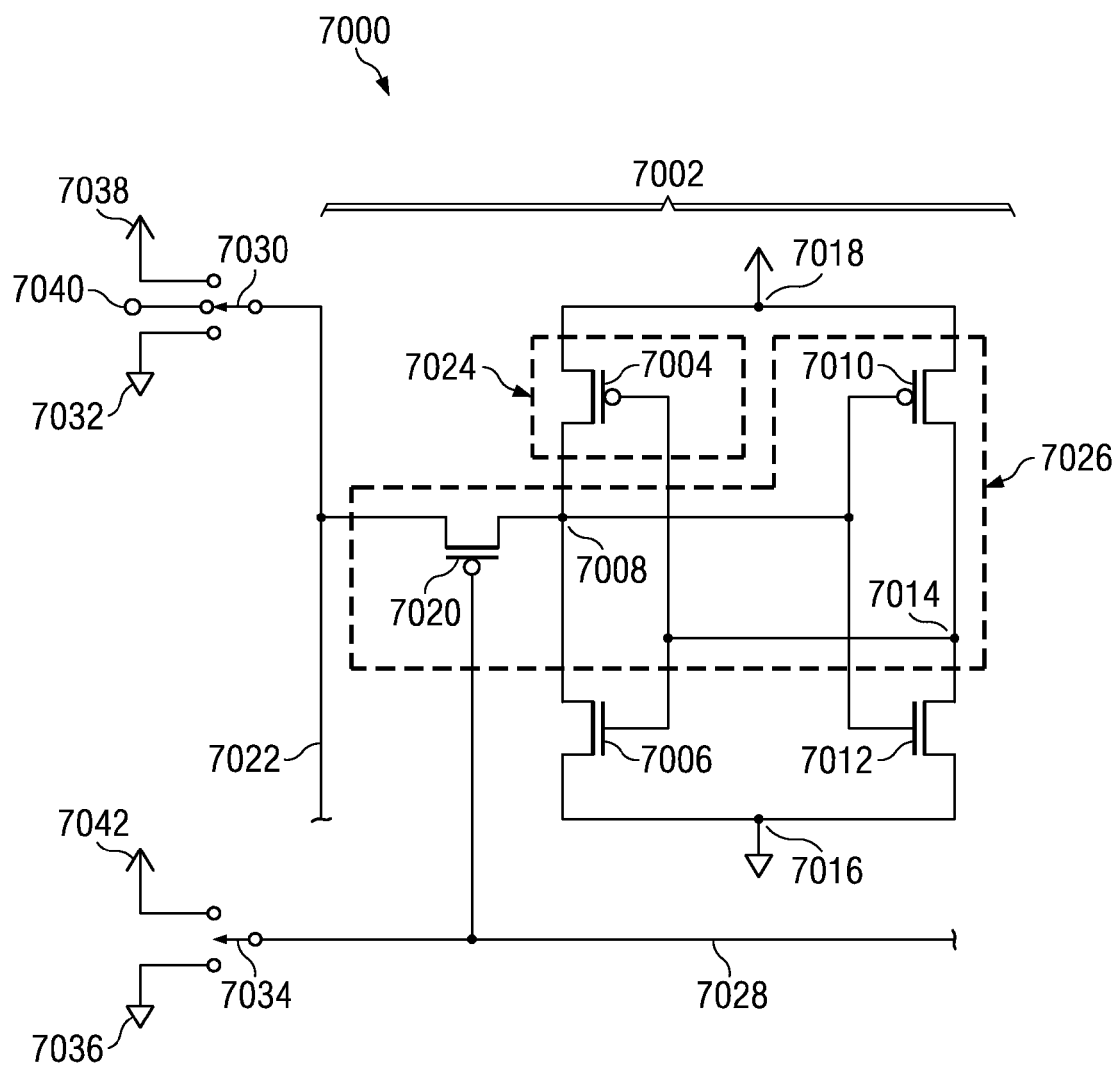
FIG. 7 is a circuit diagram of an SRAM cell in an SRAM cell array contained in an integrated circuit according to the fourth embodiment of the instant invention.

FIG. 7 is a circuit diagram of an SRAM cell in an SRAM cell array contained in an integrated circuit formed according to the fourth embodiment of the instant invention. The integrated circuit (7000) contains the SRAM cell (7002) as part of the SRAM cell array. The SRAM cell (7002) includes a bit driver (7004) and a bit load (7006). A drain node of the bit driver (7004) and a drain node of the bit load (7006) are connected to a bit-side data node (7008). The SRAM cell (7002) also includes a bit-bar driver (7010) and bit-bar load (7012). A drain node of the bit-bar driver (7010) and a drain node of the bit-bar load (7012) are connected to a bit-bar-side data node (7014). A source node of the bit load (7006) and a source node of the bit-bar load (7012) are connected to a Vss node (7016). A source node of the bit driver (7004) and a source node of the bit-bar driver (7010) are connected to a Vdd node (7018). A gate node of the bit driver (7004) and a gate node of the bit load (7006) are connected to the bit-bar-side data node (7014). Similarly, a gate node of the bit-bar driver (7010) and a gate node of the bit-bar load (7012) are connected to the bit-side data node (7008). The SRAM cell (7002) also includes a PMOS bit passgate (7020). A first source/drain node of the bit passgate (7020) is connected to the bit-side data node (7008) and a second source/drain node of the bit passgate (7020) is connected to a bit data line (7022).

The integrated circuit (7000) is formed on a p-type substrate. The bit driver (7004) is contained in a bit driver n-well (7024). The bit-bar driver (7010) and the bit passgate (7020) are contained in a bit-bar driver n-well (7026). The bit driver n-well (7024) and the bit-bar driver n-well (7026) are formed in the p-type substrate of the integrated circuit, as described supra in reference to elements (1028) and (1030) of FIG. 1. In a preferred embodiment, the bit driver n-well (7024) is electrically connected to bit driver n-wells in other SRAM cells in a same column as the SRAM cell (7002). Similarly, the bit-bar driver n-well (7026) is preferably electrically connected to bit-bar driver n-wells in other SRAM cells in the same column as the SRAM cell (7002). In a preferred embodiment, an average on-state current of the bit passgate (7020) is between 60 percent and 80 percent of an average on-state current of the bit driver (7004) (when the bit driver n-well (7024) is biased at Vdd, the source nodes of the bit passgate (7020) and bit driver (7004) are biased at Vdd, and the drain nodes of the bit passgate (7020) and bit driver (7004) are biased at Vss).

A gate node of the bit passgate (7020) is connected to a word line (7028). It is common for the bit data line (7022) to be connected to passgates in other SRAM cells in the same column as the SRAM cell (7002). Furthermore, it is common for the word line (7028) to be connected to passgates in other SRAM cells in a same row as the SRAM cell (7002).

A write low operation may be performed on the SRAM cell (7002) that results in a low voltage on the bit-side data node (7008). In a write low operation, the bit data line (7022) is coupled to a low voltage source such as Vss. For example, the bit data line (7022) is coupled to a bit data line Vss node (7032) with a bit data line switch (7030). During the write low operation on the SRAM cell (7002), the bit driver n-well (7024) is reverse biased and the bit-bar driver n-well (7026) is forward biased. This may increase a ratio of the on state current of the bit passgate (7020) to the on state current of the bit driver (7004). Furthermore, reverse biasing the bit driver n-well (7024) and forward biasing the bit-bar driver n-well (7026) during a write low operation may reduce write failures by increasing a transfer function of the potential on the bit data line (7022) to the bit-side data node (7008).

The write low operation continues with turning on the bit passgate (7020) by coupling the word line (7028) to a low voltage source such as Vss. For example, the word line (7028) may be coupled to a word line Vss node (7036) by a word line switch (7034). As a result, the potential substantially equal to Vss on the bit data line (7022) is transferred to the bit-side data node (7008).

During a write low operation, the bit driver n-wells in half-addressed SRAM cells may be forward biased and the bit-bar driver n-wells in half-addressed SRAM cells may be reverse biased. Doing so may decrease the ratios of on state currents of the passgate transistors to on state currents of the driver transistors in half-addressed SRAM cells. This may reduce data upsets in the half addressed SRAM cells by providing lower resistance paths from the bit-side data nodes to Vss and Vdd in the half addressed SRAM cells.

Figure 8A:
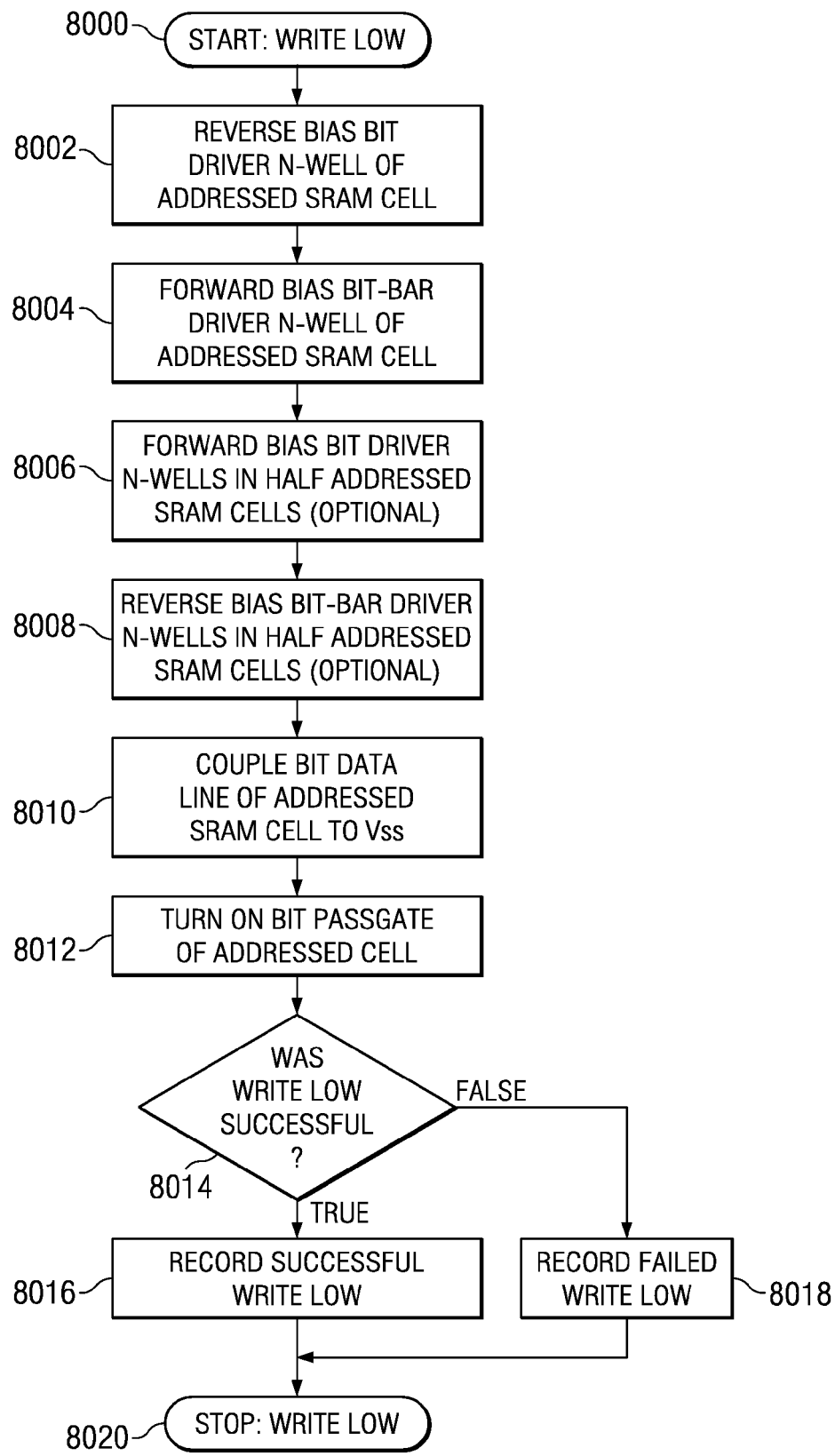
FIG. 8A through FIG. 8D are flowcharts of a write low operation, a write high operation, a read operation, and a transition to standby mode, respectively, for an SRAM array according to the fourth embodiment.

FIG. 8A through FIG. 8D are flowcharts of a write low operation, a write high operation, a read operation, and a transition to standby mode operation, respectively. The flowcharts in FIG. 8A through FIG. 8D refer to an example addressed SRAM cell such as the SRAM cell (7002) depicted in FIG. 7. Referring to FIG. 8A, the write low operation begins (8000) with step (8002) that is to reverse bias a bit driver n-well (7024) of the addressed SRAM cell (7002). Step (8004) is to forward bias a bit-bar driver n-well (7026) of the addressed SRAM cell. Then, step (8006) may be executed, which is to optionally forward bias bit driver n-wells in half-addressed SRAM cells. Next, step (8008) may be executed, which is to optionally reverse bias bit-bar driver n-wells in half-addressed SRAM cells. Step (8010) is to couple a bit data line of the addressed SRAM cell to Vss. Following execution of step (8010), step (8012) is to turn on a bit passgate (7020) of the addressed SRAM cell.

In embodiments of the write low operation that are part of test operations, following execution of step (8012), step (8014) is determining whether a low voltage was successfully transferred to a bit-side data node (7008). If the low voltage was successfully transferred to the bit-side data node, step (8016) is to record a successful write low operation for the addressed SRAM cell. Conversely, if the low voltage was not successfully transferred to the bit-side data node, then step (8018) is to record a failed write low operation for the addressed SRAM cell. After step (8016) or step (8018) is executed—or after step (8012) is executed in embodiments which are not part of test operations—the write low operation is ended at step (8020). In other embodiments of the write low operation, steps (8002), (8004), (8006), (8008) and (8010) may be performed in any order.

Referring back to FIG. 7, a write high operation may be performed on the SRAM cell (7002) that results in a high voltage on the bit-side data node (7008). In a write high operation, the bit data line (7022) is coupled to a high voltage source such as Vdd. For example, the bit data line (7022) may be coupled to bit data line Vdd node (7038) by the bit data line switch (7030). During the write high operation on the SRAM cell (7002), the bit driver n-well (7024) is reverse biased and the bit-bar driver n-well (7026) is forward biased, to possibly increase a ratio of the on state current of the bit passgate (7020) to the on state current of the bit driver (7004). Furthermore, reverse biasing the bit driver n-well (7024) and forward biasing the bit-bar driver n-well (7026) during a write high operation may reduce write failures by increasing a transfer function of the potential on the bit data line (7022) to the bit-side data node (7008). Moreover, during a write high operation, the bit driver n-wells in half-addressed SRAM cells may be forward biased and the bit-bar driver n-wells in half-addressed SRAM cells may be reverse biased to possibly reduce data upsets.

The write high operation continues with turning on the bit passgate (7020) by coupling the word line (7028) to a low voltage source such as Vss. For example, the word line (7028) may be coupled to a word line Vss node (7036) by a word line switch (7034). As a result, the potential substantially equal to Vdd on the bit data line (7022) is transferred to the bit-side data node (7008).

Figure 8B:
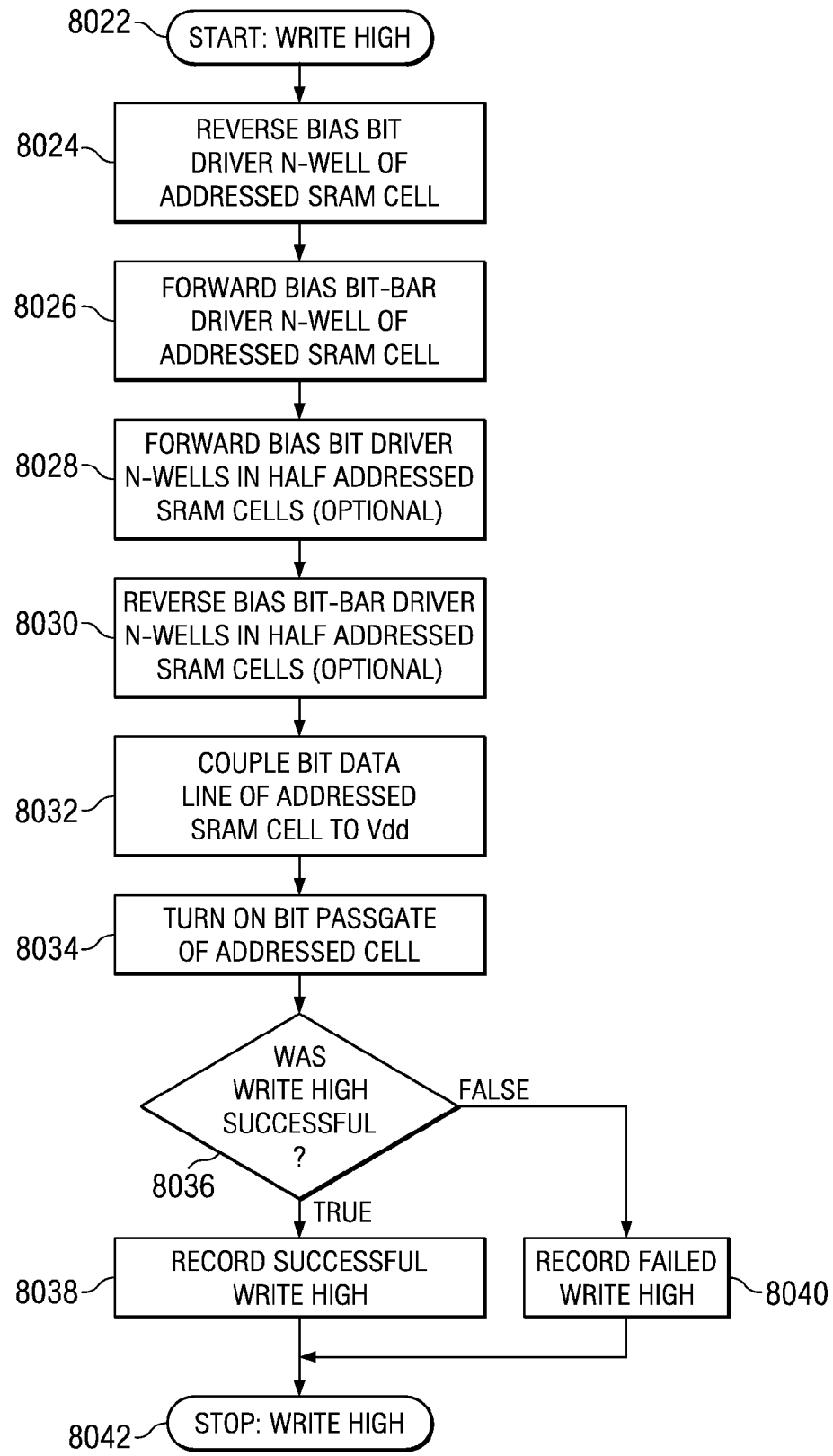

Referring to FIG. 8B, the write high operation begins (8022) with step (8024) that is to reverse bias the bit driver n-well (7024) of the addressed SRAM cell (7002). Step (8026) is to forward bias the bit-bar driver n-well (7026) of the addressed SRAM cell. Then, step (8028) may be executed, which is to optionally forward bias bit driver n-wells in half-addressed SRAM cells. Next, step (8030) may be executed, which is to optionally reverse bias bit-bar driver n-wells in half-addressed SRAM cells. Step (8032) is to couple the bit data line of the addressed SRAM cell to Vdd. Following the execution of step (8032), step (8034) is to turn on the bit passgate (7020) of the addressed SRAM cell.

In embodiments of the write high operation that are part of test operations, following execution of step (8034), step (8036) is determining whether a high voltage was successfully transferred to a bit-side data node (7008). If the high voltage was successfully transferred to the bit-side data node, step (8038) is to record a successful write high operation for the addressed SRAM cell. Conversely, if the high voltage was not successfully transferred to the bit-side data node, then step (8040) is to record a failed write low operation for the addressed SRAM cell. After step (8038) or step (8040) is executed—or after step (8034) is executed in embodiments which are not part of test operations—the write high operation is ended at step (8042). In other embodiments of the write low operation, steps (8024), (8026), (8028), (8030) and (8032) may be performed in any order.

Referring back to FIG. 7, a read operation may be performed to read a data bit from the SRAM cell (7002). In a read operation, the bit data line (7022) is coupled to a low voltage source such as Vss. For example, the bit data line (7022) may be coupled to the bit data line Vss node (7032) through the bit data line switch (7030) in order to pre-charge the bit data line (7022) to a low voltage. After the bit data line (7022) is pre-charged, the bit data line (7022) is floated (this is depicted schematically in FIG. 7 by the bit data line floating node (7040)). During the read operation on the SRAM cell (7002), the bit driver n-well (7024) is forward biased and the bit-bar driver n-well (7026) is reverse biased to possibly decrease the ratio of the on state current of the bit passgate (7020) to the on state current of the bit driver (7004). Forward biasing the bit driver n-well (7024) and reverse biasing the bit-bar driver n-well (7026) during a read operation may reduce read failures by providing a lower resistance path between the bit-side data node (7008) and Vdd (compared to the resistance path between the bit-side data node (7008) and the bit data line (7022)). During a read operation, the bit driver n-wells in half-addressed SRAM cells may be forward biased and the bit-bar driver n-wells in half-addressed SRAM cells may be reverse biased to possibly reduce data upsets.

The read operation continues with turning on the bit passgate (7020) by coupling the word line (7028) to a low voltage source such as Vss. For example, the word line (7028) may be coupled to the word line Vss node (7036) by word line switch (7034). As a result, a potential on the bit-side data node (7008) is transferred to the bit data line (7022). This in turn triggers external circuitry (such as a sense amplifier coupled to the bit data line (7022)) to make available to other circuitry outside the SRAM cell array the data bit on the bit-side data node (7008).

Figure 8C:
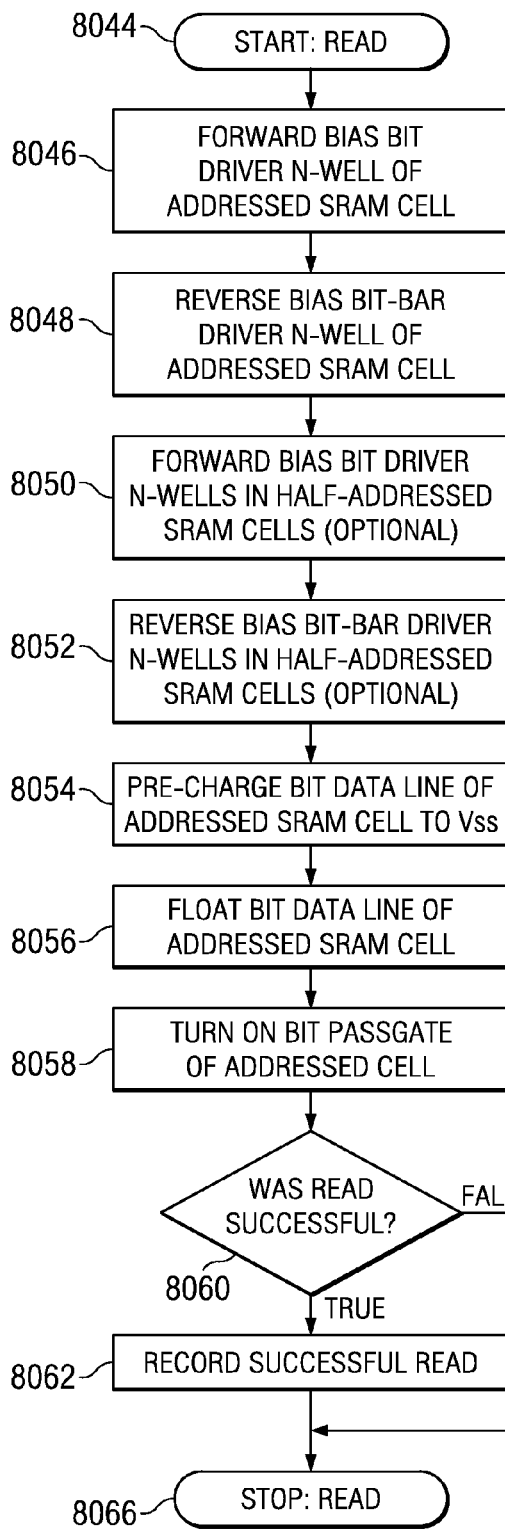

Referring to FIG. 8C, the read operation begins (8044) with step (8046) that is to forward bias the bit driver n-well (7024) of the addressed SRAM cell. Step (8048) is to reverse bias the bit-bar driver n-well (7026) of the addressed SRAM cell. Then, step (8050) may be executed, which is to optionally forward the bias bit driver n-wells in half-addressed SRAM cells. Next, step (8052) may be executed, which is to optionally reverse bias the bit-bar driver n-wells in half-addressed SRAM cells. Step (8054) is to couple the bit data line (7022) of the addressed SRAM cell to Vss. Then, step (8056) is to float the bit data line of the addressed SRAM cell. Following the execution of step (8056), step (8058) is to turn on a bit passgate (7020) of the addressed SRAM cell.

In embodiments of the read operation that are part of test operations, following execution of step (8058), step (8060) is determining whether a potential on the bit-side data node (7008) was successfully transferred to the bit data line (7022). If the potential on the bit-side data node was successfully transferred to the bit data line, step (8062) is to record a successful read operation for the addressed SRAM cell. Conversely, if the potential on the bit-side data node was not successfully transferred to the bit data line, then step (8064) is to record a failed read operation for the addressed SRAM cell. After step (8062) or step (8064) is executed—or after step (8058) is executed in embodiments which are not part of test operations—the read operation is ended at step (8066). In other embodiments of the read operation, steps (8046), (8048), (8050) and (8054) may be performed in any order.

Referring back to FIG. 7, the SRAM cell (7002) may be transitioned to a standby mode by turning off the bit passgate (7020). This is accomplished by coupling the word line (7028) to a high voltage source such as Vdd (as depicted schematically in FIG. 7 by the word line switch (7034) coupling the word line (7028) to a word line Vdd node (7042)). During the standby mode, the bit driver n-well (7024) and the bit-bar driver n-well (7026) are reverse biased to possibly reduce the leakage currents through the bit driver (7004) and the bit passgate (7020).

Figure 8D:
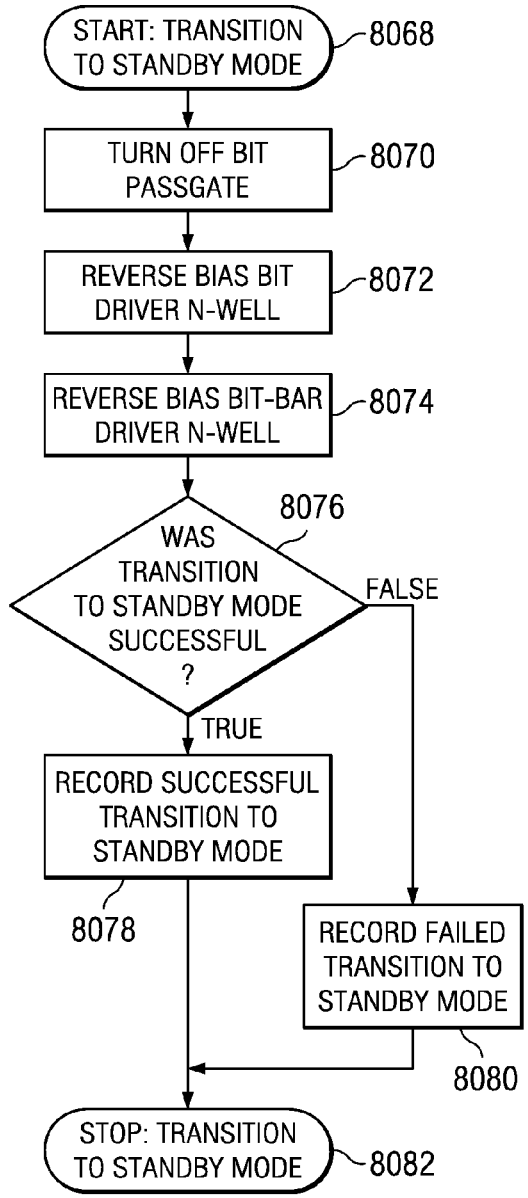

Referring to FIG. 8D, the transition to standby mode operation begins (8068) with step (8070) that is to turn off the bit passgate (7020). Step (8072) is to reverse bias the bit driver n-well (7024). Next, step (8074) is to reverse bias the bit-bar driver n-well (7026).

In embodiments of the transition to standby mode operation that are part of test operations (such as measurements of the leakage currents in SRAM cell arrays), step (8076) is determining whether the transition to standby mode was successful (for example, whether the leakage currents were below target values). If the transition to standby mode was successful, then step (8078) is to record a successful transition to standby mode operation for the addressed SRAM cell. Conversely, if the transition to standby mode was not successful, then step (8080) is to record a failed transition to standby mode operation for the addressed SRAM cell. After step (8078) or step (8080) is executed—or after step (8074) is executed in embodiments which are not part of test operations—the transition to standby mode operation is ended at step (8082). In other embodiments of the transition to standby mode operation, steps (8070), (8072) and (8074) may be performed in any order.

Figure 9:
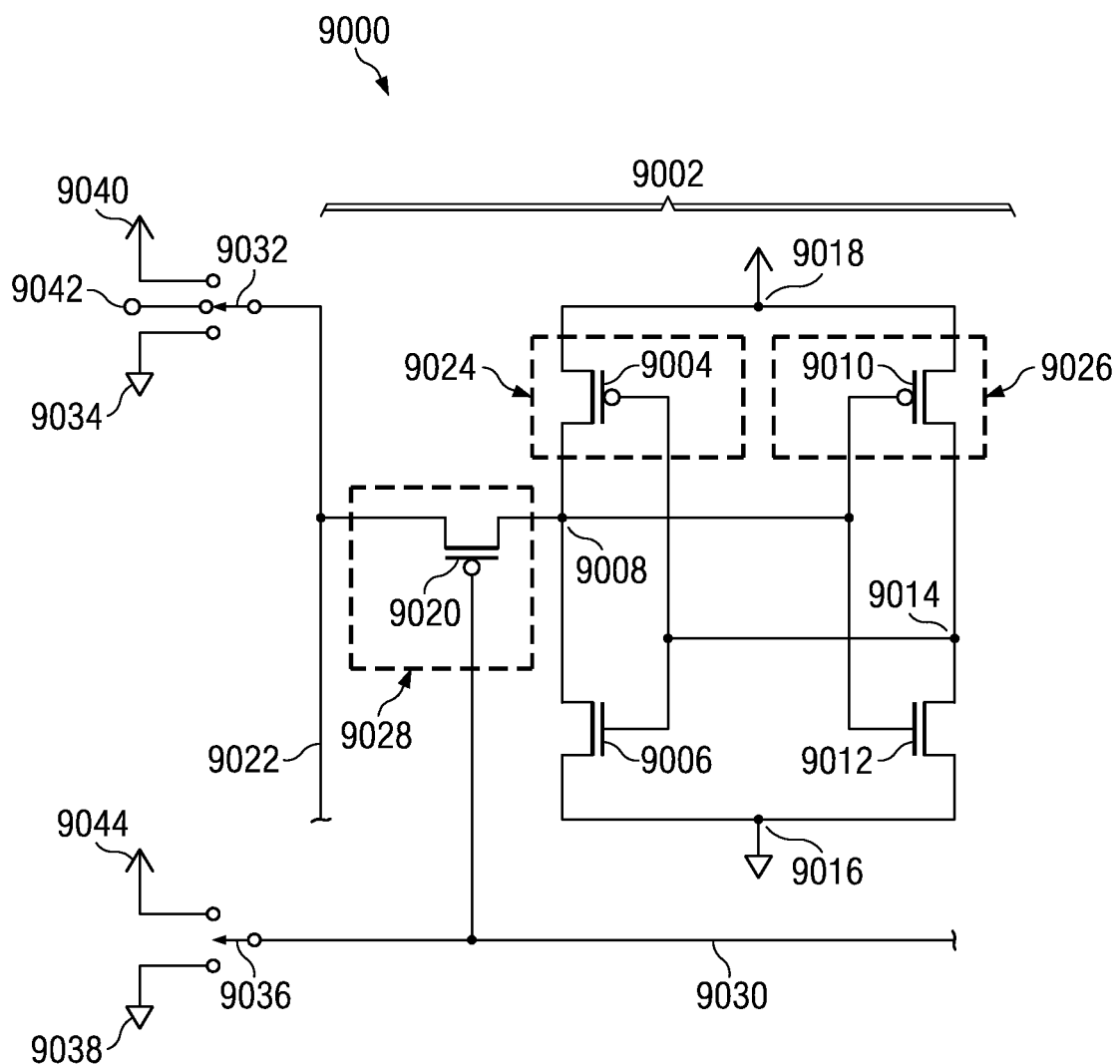
FIG. 9 is a circuit diagram of an SRAM cell in an SRAM cell array contained in an integrated circuit according to the fifth embodiment of the instant invention.

FIG. 9 is a circuit diagram of an SRAM cell in an SRAM cell array contained in an integrated circuit formed according to the fifth embodiment of the instant invention. The integrated circuit (9000) contains the SRAM cell (9002) as part of the SRAM cell array. The SRAM cell (9002) includes a bit driver (9004) and a bit load (9006). A drain node of the bit driver (9004) and a drain node of the bit load (9006) are connected to a bit-side data node (9008). The SRAM cell (9002) also includes a bit-bar driver (9010) and bit-bar load (9012). A drain node of the bit-bar driver (9010) and a drain node of the bit-bar load (9012) are connected to a bit-bar-side data node (9014). A source node of the bit load (9006) and a source node of the bit-bar load (9012) are connected to a Vss node (9016). A source node of the bit driver (9004) and a source node of the bit-bar driver (9010) are connected to a Vdd node (9018). A gate node of the bit driver (9004) and a gate node of the bit load (9006) are connected to the bit-bar-side data node (9014). Similarly, a gate node of the bit-bar driver (9010) and a gate node of the bit-bar load (9012) are connected to the bit-side data node (9008).

The SRAM cell (9002) also includes a PMOS bit passgate (9020). A first source/drain node of the bit passgate (9020) is connected to the bit-side data node (9008) and a second source/drain node of the bit passgate (9020) is connected to a bit data line (9022).

The integrated circuit (9000) is formed on a p-type substrate. The bit driver (9004) is contained in a bit driver n-well (9024). The bit-bar driver (9010) is contained in a bit-bar driver n-well (9026). The bit passgate (9020) is contained in a passgate n-well (9028). The bit driver n-well (9024), bit-bar driver n-well (9026) and passgate n-well (9028) are formed in the p-type substrate of the integrated circuit, as described in reference to elements (1028) and (1030) of FIG. 1. In a preferred embodiment, the bit driver n-well (9024) is electrically connected to bit driver n-wells in other SRAM cells in a same column as the SRAM cell (9002). Similarly, the bit-bar driver n-well (9026) is preferably electrically connected to bit-bar driver n-wells in other SRAM cells in the same column as the SRAM cell (9002), and the passgate n-well (9028) is preferably electrically connected to passgate n-wells in other SRAM cells in the same column as the SRAM cell (9002).

A gate node of the bit passgate (9020) is connected to a word line (9030). In a preferred embodiment, an average on-state current of the bit passgate (9020) is between 60 percent and 80 percent of an average on-state current of the bit driver (9004) (i.e. when the bit driver n-well (9024) and passgate n-well (9028) are biased at Vdd, the source nodes of the bit passgate (9020) and bit driver (9004) are biased at Vdd, and the drain nodes of the bit passgate (9020) and bit driver (9004) are biased at Vss). It is common for the bit data line (9022) to be connected to bit passgates in other SRAM cells in the same column as the SRAM cell (9002). Furthermore, it is common for the word line (9030) to be connected to bit passgates in other SRAM cells in a same row as the SRAM cell (9002).

A write low operation may be performed on the SRAM cell (9002) that results in a low voltage on the bit-side data node (9008). In a write low operation, the bit data line (9022) is coupled to a low voltage source such as Vss. For example, the bit data line (9022) may be coupled to a bit data line Vss node (9034) with a bit data line switch (9032). During the write low operation on the SRAM cell (9002), the bit driver n-well (9024) is reverse biased and the passgate n-well (9028) is forward biased to possibly increase a ratio of the on state current of the bit passgate (9020) to the on state current of the bit driver (9004). Furthermore, the bit-bar driver n-well (9026) may optionally be reverse biased to possibly increase an electrical resistance between the bit-bar-side data node (9014) and the Vdd node (9018). Moreover, reverse biasing the bit driver n-well (9024) and forward biasing the passgate n-well (9028) during a write low operation may reduce write failures by increasing a transfer function of the potential on the bit data line (9022) to the bit-side data node (9008).

The write low operation continues with turning on the bit passgate (9020) by coupling the word line (9030) to a low voltage source such as Vss. For example, the word line (9030) may be coupled to a word line Vss node (9038) through a word line switch (9036). As a result, the potential substantially equal to Vss on the bit data line (9022) is transferred to the bit-side data node (9008).

During a write low operation, the bit driver n-wells and the bit-bar driver n-wells in half-addressed SRAM cells may be forward biased, and the passgate n-wells in half-addressed SRAM cells may be reverse biased. Doing so may decrease the ratios of the on state currents of the passgate transistors to the on state currents of driver transistors in half-addressed SRAM cells. This may also reduce data upsets in the half addressed SRAM cells by providing lower resistance paths from the bit-side data nodes and the bit-bar-side data nodes to Vss and Vdd in the half addressed SRAM cells.

Figure 10A:
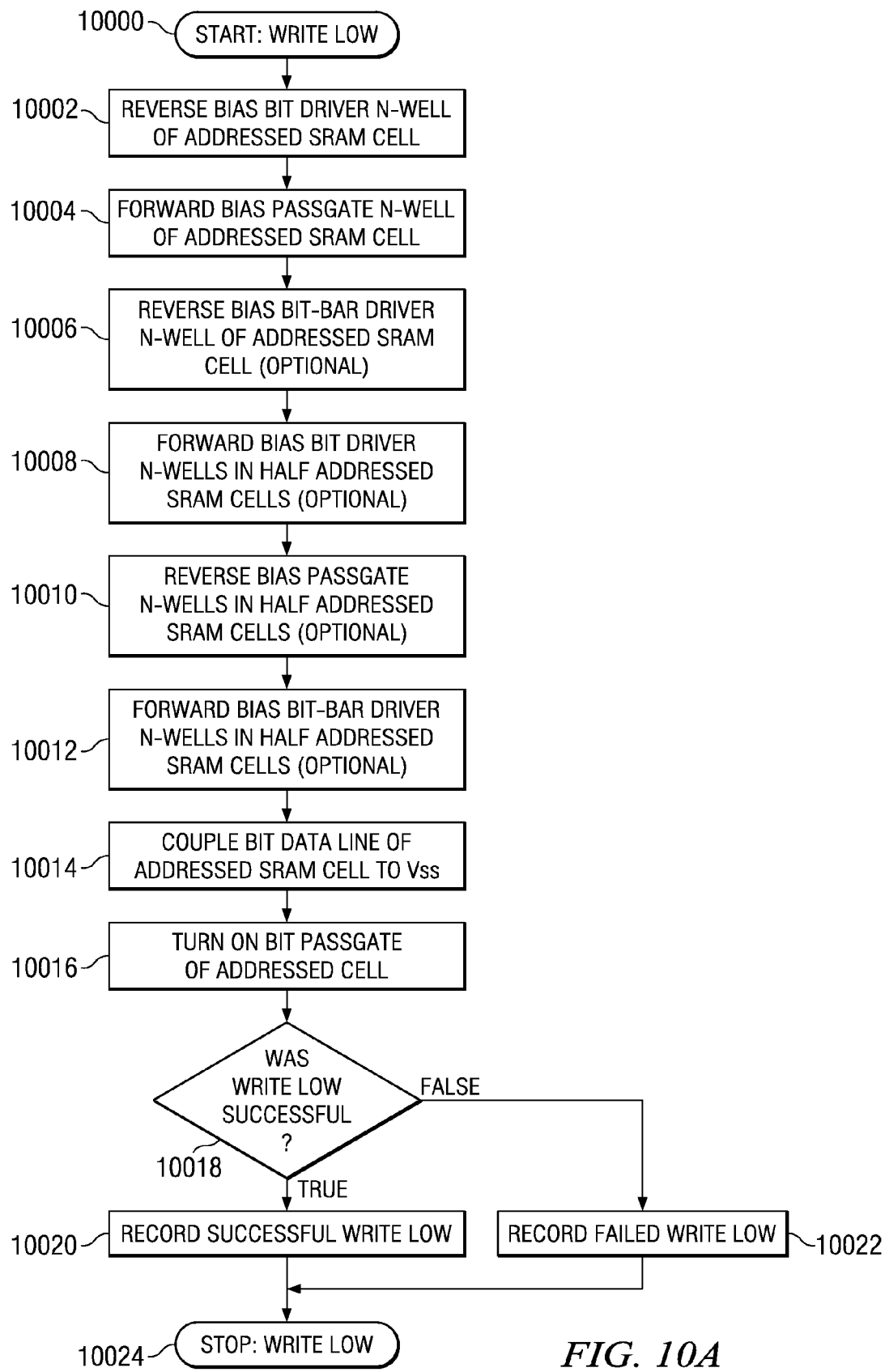
FIG. 10A through FIG. 10D are flowcharts of a write low operation, a write high operation, a read operation, and a transition to standby mode, respectively, for an SRAM array according to the fifth embodiment.

FIG. 10A through FIG. 10D are flowcharts of a write low operation, a write high operation, a read operation, and a transition to standby mode, respectively. The flowcharts in FIG. 10A through FIG. 10D refer to an addressed SRAM cell, such as SRAM cell (9002) depicted in FIG. 9. Referring to FIG. 10A, the write low operation begins (10000) with step (10002) that is to reverse bias a bit driver n-well (9024) of the addressed SRAM cell (9002). Step (10004) is to forward bias a passgate n-well (9028) of the addressed SRAM cell. Then, step (10006) may be executed, which is to optionally reverse bias a bit-bar driver n-well (9026) of the addressed SRAM cell. Next, step (10008) may be executed, which is to optionally forward bias bit driver n-wells in half-addressed SRAM cells. Then, step (10010) may be executed, which is to optionally forward bias bit-bar driver n-wells in half-addressed SRAM cells. Next, step (10012) may be executed, which is to optionally reverse bias passgate n-wells in half-addressed SRAM cells. Step (10014) is to couple a bit data line (9022) of the addressed SRAM cell to Vss (9034). Following execution of step (10014), step (10016) is to turn on a bit passgate (9020) of the addressed SRAM cell.

In embodiments of the write low operation that are part of test operations, following execution of step (10016), step (10018) is determining whether a low voltage was successfully transferred to a bit-side data node (9008). If the low voltage was successfully transferred to the bit-side data node, step (10020) is to record a successful write low operation for the addressed SRAM cell. Conversely, if the low voltage was not successfully transferred to the bit-side data node, then step (10022) is to record a failed write low operation for the addressed SRAM cell. After step (10020) or step (10022) is executed—or after step (10016) is executed in embodiments which are not part of test operations—the write low operation is ended at step (10024). In other embodiments of the write low operation, steps (10002), (10004), (10006), (10008), (10010), (10012), and (10014) may be performed in any order.

Referring back to FIG. 9, a write high operation may be performed on the SRAM cell (9002) that results in a high voltage on the bit-side data node (9008). In a write high operation, the bit data line (9022) is coupled to a high voltage source such as Vdd. For example, the bit data line (9022) may be coupled to a bit data line Vdd node (9040) using the bit data line switch (9032). During the write high operation on the SRAM cell (9002), the bit driver n-well (9024) is reverse biased and the passgate n-well (9028) is forward biased to possibly increase a ratio of the on state current of the bit passgate (9020) to the on state current of the bit driver (9004). In addition, the bit-bar driver n-well (9026) may optionally be reverse biased to possibly increase an electrical resistance between the bit-bar-side data node (9014) and the Vdd node (9018). Reverse biasing the bit driver n-well (9024) and forward biasing the passgate n-well (9028) during a write high operation may reduce write failures by increasing a transfer function of the potential on the bit data line (9022) to the bit-side data node (9008). Furthermore, during a write high operation, the bit driver n-wells and the bit-bar driver n-wells in half-addressed SRAM cells may be forward biased, plus the passgate n-wells in half-addressed SRAM cells may be reverse biased, to possibly reduce data upsets.

The write high operation continues with turning on the bit passgate (9020) by coupling the word line (9030) to a low voltage source such as Vss. For example, the word line (9030) may be coupled to the word line Vss node (9038) with the word line switch (9036). As a result, the potential substantially equal to Vdd on the bit data line (9022) is transferred to the bit-side data node (9008).

Figure 10B:
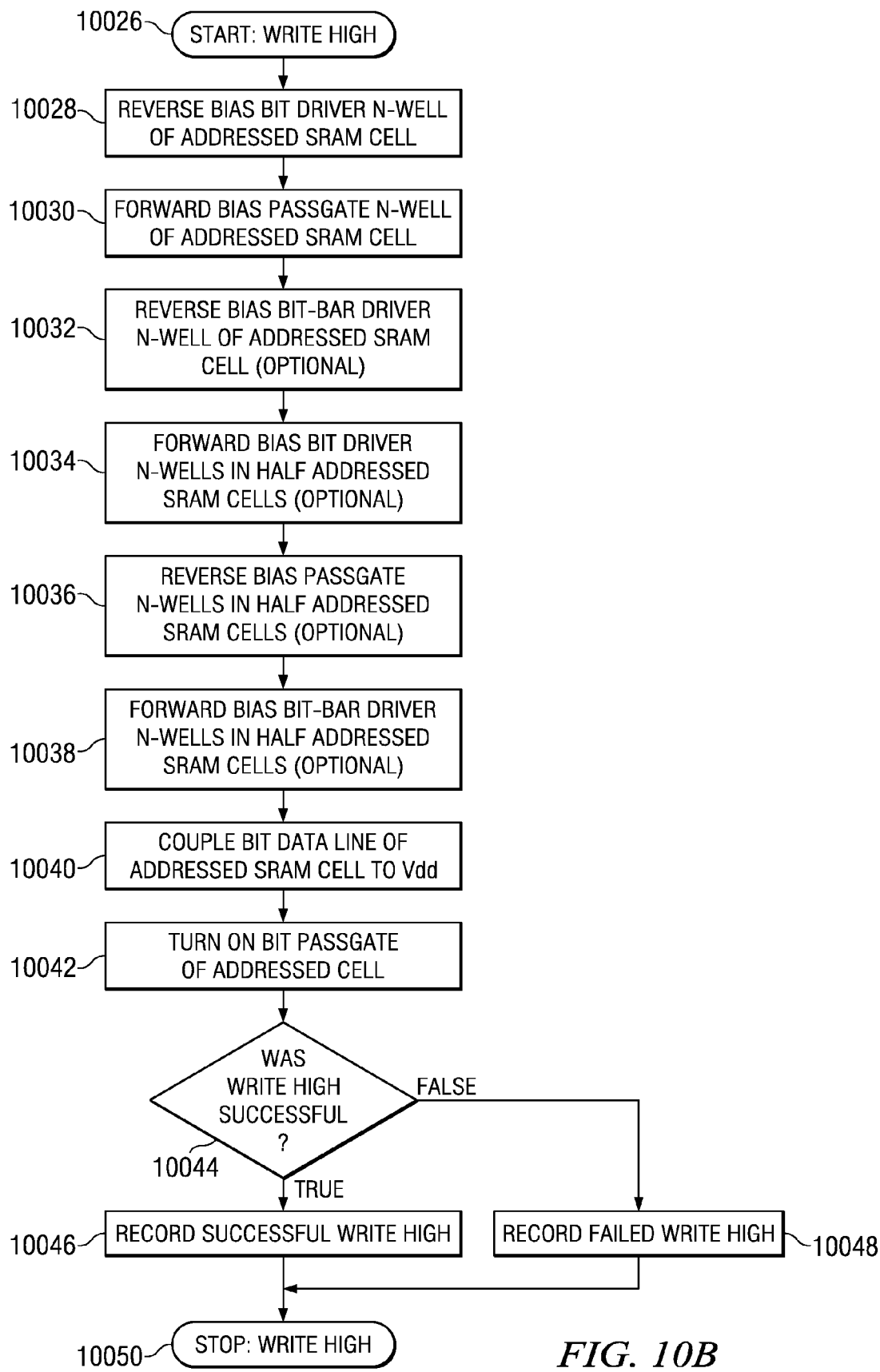

Referring to FIG. 10B, the write high operation begins (10026) with step (10028) that is to reverse bias the bit driver n-well (9024) of the addressed SRAM cell (9002). Step (10030) is to forward bias a passgate n-well (9028) of the addressed SRAM cell. Then, step (10032) may be executed, which is to optionally reverse bias a bit-bar driver n-well (9026) of the addressed SRAM cell. Next, step (10034) may be executed, which is to optionally forward bias bit driver n-wells in half-addressed SRAM cells. Then, step (10036) may be executed, which is to optionally reverse bias passgate n-wells in half-addressed SRAM cells. Next, step (10038) may be executed, which is to optionally forward bias bit-bar driver n-wells in half-addressed SRAM cells. Step (10040) is executed, which is to couple a bit data line (9022) of the addressed SRAM cell to Vdd (9040). Following execution of step (10040), step (10042) is to turn on a bit passgate (9020) of the addressed SRAM cell.

In embodiments of the write low operation that are part of test operations, following execution of step (10042), step (10044) is determining whether a high voltage was successfully transferred to a bit-side data node (9008). If the high voltage was successfully transferred to the bit-side data node, step (10046) is to record a successful write low operation for the addressed SRAM cell. Conversely, if the high voltage was not successfully transferred to the bit-side data node, then step (10048) is to record a failed write low operation for the addressed SRAM cell. After step (10046) or step (10048) is executed—or after step (10042) is executed in embodiments which are not part of test operations—the write low operation is ended at step (10050). In other embodiments of the write low operation, steps (10028), (10030), (10032), (10034), (10036), (10038), and (10040) may be performed in any order.

Referring back to FIG. 9, a read operation may be performed to read a data bit from the SRAM cell (9002). In a read operation, the bit data line (9022) is coupled to a low voltage source such as Vss. For example, the bit data line (9022) is coupled to the bit data line Vss node (9034) through the bit data line switch (9032) in order to pre-charge the bit data line (9022) to a low voltage. After the bit data line (9022) is pre-charged, the bit data line (9022) is floated (as depicted schematically in FIG. 9 by the bit data line switch (9032) coupling the bit data line (9022) to a bit data line floating node (9042)).

During the read operation on the SRAM cell (9002), the bit driver n-well (9024) is forward biased and the passgate n-well (9028) is reverse biased to possibly decrease the ratio of the on state current of the bit passgate (9020) to the on state current of the bit driver (9004). In addition, the bit-bar driver n-well (9026) may optionally be forward biased to possibly decrease an electrical resistance between the bit-bar-side data node (9014) and the Vdd node (9018). Forward biasing the bit driver n-well (9024) and reverse biasing the passgate n-well (9028) during a read operation may reduce read failures by providing a lower resistance path between the bit-side data node (9008) and Vdd (as compared to the resistance path between the bit-side data node (9008) and the bit data line (9022)). Moreover, during a read operation, the bit driver n-wells in half-addressed SRAM cells may be forward biased and the passgate n-wells in half-addressed SRAM cells may be reverse biased to possibly reduce data upsets.

The read operation continues with turning on the bit passgate (9020) by coupling the word line (9030) to a low voltage source such as Vss. For example, the word line switch (9036) may couple the word line (9030) to the word line Vss node (9038). In a successful read operation, a potential on the bit-side data node (9008) is transferred to the bit data line (9022). This in turn triggers external circuitry (such as a sense amplifier) that is coupled to the bit data line (9022) to make the data bit available to other circuitry outside the SRAM cell array.

Figure 10C:
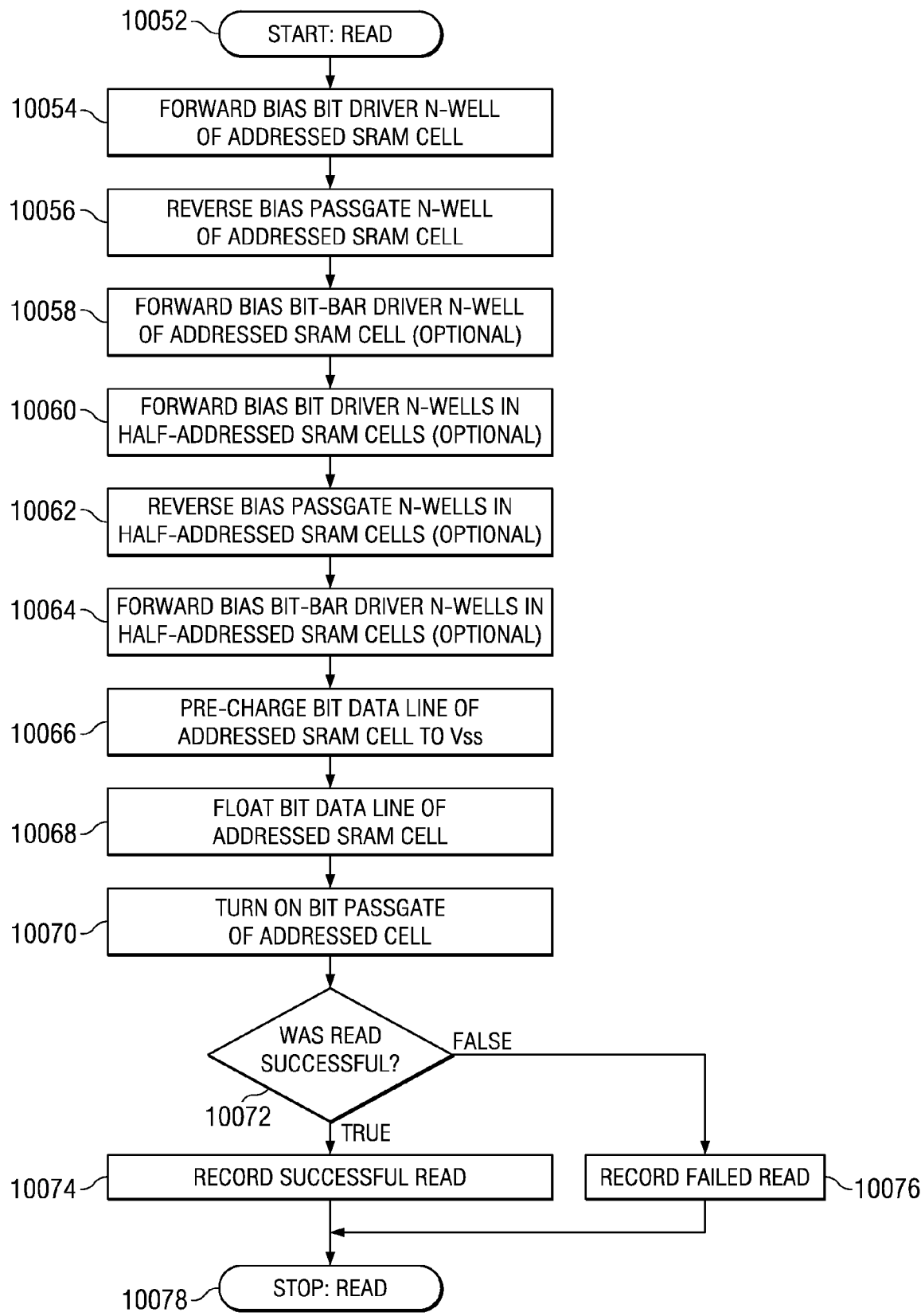

Referring to FIG. 10C, the read operation begins (10052) with step (10054) that is to forward bias the bit driver n-well (9024) of the addressed SRAM cell (9002). Step (10056) is to reverse bias the passgate n-well (9028) of the addressed SRAM cell. Next, step (10058) may be executed, which is to optionally forward bias the bit-bar driver n-well (9026) of the addressed SRAM cell. Then, step (10060) may be executed, which is to optionally forward bias bit driver n-wells in half-addressed SRAM cells. Next, step (10062) may be executed, which is to optionally reverse bias passgate n-wells in half-addressed SRAM cells. Then, step (10064) may be executed, which is to optionally forward bias bit-bar driver n-wells in half-addressed SRAM cells. Step (10066) is to couple the bit data line (9022) of the addressed SRAM cell to Vss (9034). Then, step (10068) is to float the bit data line of the addressed SRAM cell. Following execution of step (10068), step (10070) is to turn on a bit passgate (9020) of the addressed SRAM cell.

In embodiments of the read operation that are part of test operations, following execution of step (10070), step (10072) is determining whether a potential on the bit-side data node (9008) was successfully transferred to the bit data line. If the potential on the bit-side data node was successfully transferred to the bit data line, step (10074) is to record a successful read operation for the addressed SRAM cell. Conversely, if the potential on the bit-side data node was not successfully transferred to the bit data line, then step (10076) is to record a failed read operation for the addressed SRAM cell. After step (10074) or step (10076) is executed—or after step (10070) is executed in embodiments which are not part of test operations—the read operation is ended at step (10078). In other embodiments of the read operation, steps (10054), (10056), (10058), (10060), (10062), (10064) and (10066) may be performed in any order.

Referring back to FIG. 9, the SRAM cell (9002) may be transitioned to a standby mode by turning off the bit passgate (9020). This is accomplished by coupling the word line (9030) to a high voltage source such as Vdd (as depicted schematically in FIG. 9 by the word line switch (9036) coupling the word line (9030) to a word line Vdd node (9044)). During the standby mode, the bit driver n-well (9024), the passgate n-well (9028), and the bit-bar driver n-well (9026) are reverse biased to possibly reduce the leakage currents through the bit driver (9004), the bit passgate (9020) and the bit-bar driver (9010).

Figure 10D:
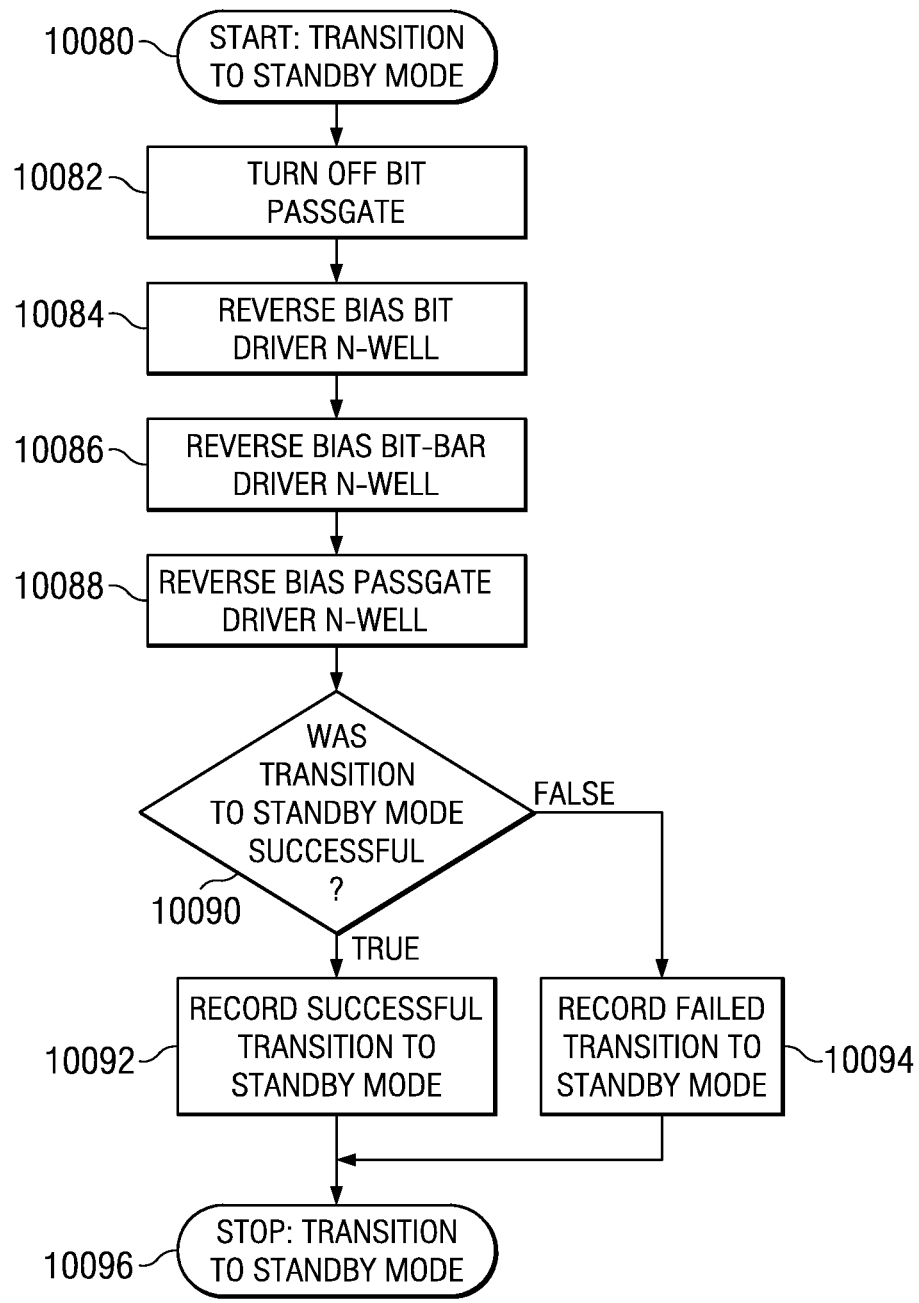

Referring to FIG. 10D, the transition to standby mode operation begins (10080) with step (10082) that is to turn off the bit passgate (9020). Step (10084) is to reverse bias the bit driver n-well (9024). Then, step (10086) is to reverse bias the bit-bar driver n-well (9026). Next, step (10088) is to reverse bias the passgate n-well (9028).

In embodiments of the transition to standby mode operation which are part of test operations (such as measurements of leakage currents in SRAM cell arrays) step (10090) is to determine if the transition to standby mode was successful (for example, whether the leakage currents were below target values). If the transition to standby mode was successful, step (10092) is to record a successful transition to standby mode operation for the addressed SRAM cell. Conversely, if the transition to standby mode was not successful, then step (10094) is to record a failed transition to standby mode operation for the addressed SRAM cell. After step (10092) or step (10094) is executed—or after step (10088) is executed in embodiments which are not part of test operations—the transition to standby mode operation is ended at step (10096). In other embodiments of the transition to standby mode operation, steps (10082), (10084), (10086) and (10088) may be performed in any order.

The embodiments discussed above in reference to FIG. 1, FIG. 3, FIG. 5, FIG. 7 and FIG. 9 may be improved by adjusting a bias to the n-wells containing driver transistors so as to control within a desired range the ratios of an average on-state current of the driver transistors to an average on-state current of load transistors. Moreover, the embodiments discussed above in reference to FIG. 1, FIG. 3, FIG. 5, FIG. 7 and FIG. 9 may be further improved by adjusting a bias to the n-wells containing the passgate transistors so as to control within a desired range the ratios of an average on-state current of the passgate transistors to an average on-state current of load transistors.

Figure 11:
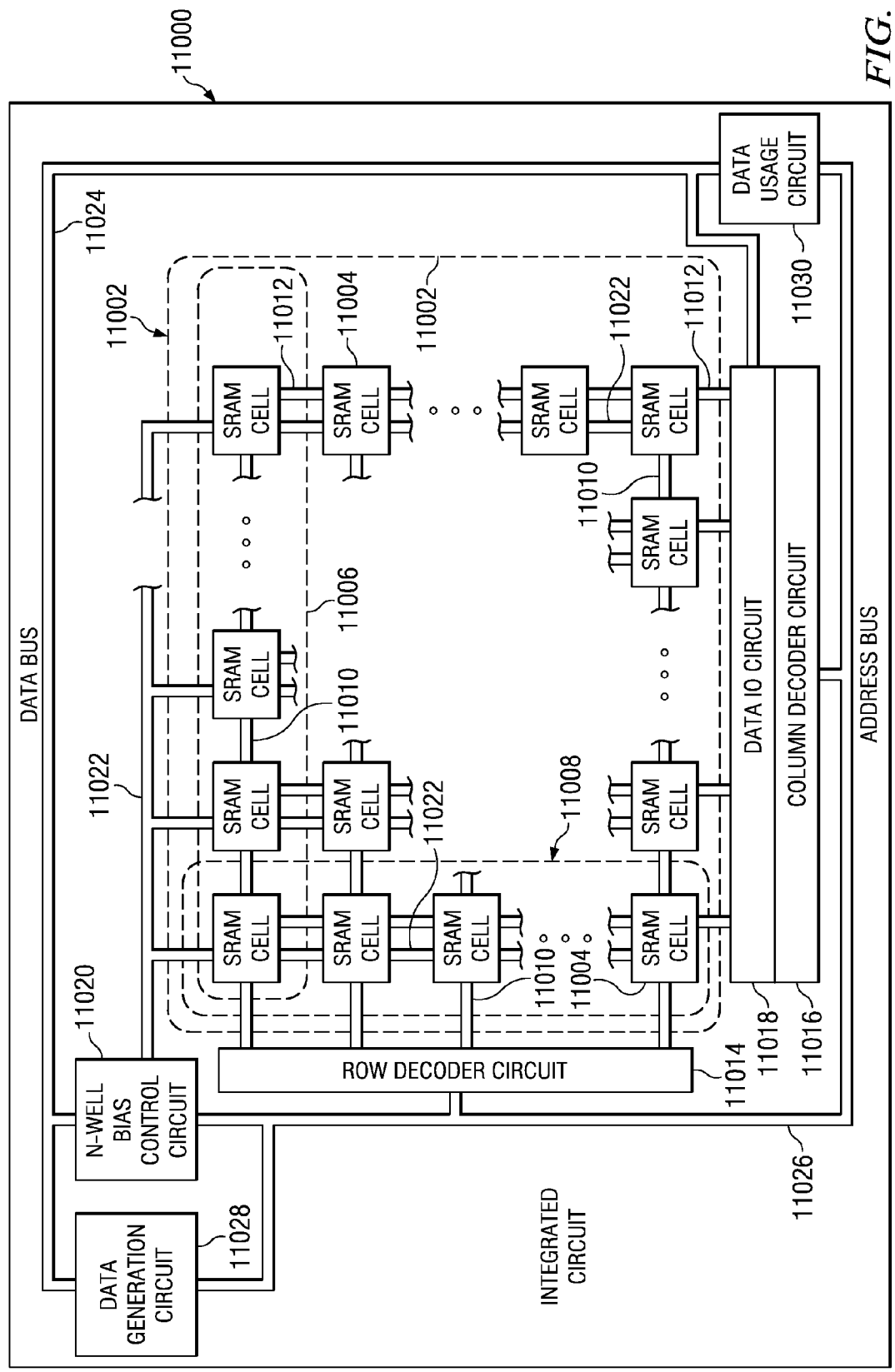
FIG. 11 depicts an integrated circuit containing an SRAM cell array which includes SRAM cells according to an embodiment of the instant invention.

FIG. 11 depicts an integrated circuit (11000) containing an SRAM cell array (11002) which includes SRAM cells (11004) formed according to an embodiment. The SRAM cells (11004) are arranged in rows (11006) and columns (11008). Each word line (11010) is coupled to SRAM cells (11004) in a row (11006). In addition, each bit line bus (11012) is coupled to SRAM cells (11004) in a column (11008). Each bit line bus (11012) may include one or more bit data lines or bit-bar data lines. A row decoder circuit (11014) applies appropriate biases to word lines (11010). A column decoder circuit (11016) applies appropriate biases to bit data lines or bit-bar data lines within the bit line buses (11012). A data input/output (IO) circuit (11018) reads data from the bit data lines or bit-bar data lines within the bit line buses (11012) during read operations. The data input/output (IO) circuit (11018) also applies the appropriate potentials to the bit data lines or bit-bar data lines within the bit line buses (11012) during write operations. An n-well bias control circuit (11020) applies biases to an n-well bias bus (11022) that is coupled to n-wells containing PMOS transistors in the SRAM cells (11004). The n-well bias control circuit (11020) is capable of independently biasing the n-wells by column, and independently biasing separate n-wells containing separate PMOS transistors in the SRAM cells (11004).

The integrated circuit further includes a data bus (11024) that carries data bits between the SRAM cell array (11002) and other circuitry within the integrated circuit (11000). In addition, the example integrated circuit (11000) has an address bus (11026) that is used to select SRAM cells (11004) within the SRAM cell array (11002) for read and write operations. The address bus (11026) is coupled to the row decoder circuit (11014), the column decoder circuit (11016), and the n-well bias control circuit (11020). The integrated circuit (11000) may also contain a data generation circuit (11028) that is coupled to the data bus (11024) and the address bus (11026). The data generation circuit (11028) produces incoming data bits for storage in the SRAM cell array (11002). Then the data bus (11024) carries the incoming data bits from the data generation circuit (11028) to the SRAM cell array (11002). Moreover, the integrated circuit (11000) may contain a data usage circuit (11030) that is coupled to the data bus (11024) and the address bus (11026). The data usage circuit (11030) processes outgoing data bits which were stored in the SRAM cell array (11002). The data bus (11024) carries the outgoing data bits from the SRAM cell array (11002) to the data usage circuit (11030).

While various embodiments have been described above, it should be understood that they have been presented by way of example only and not limitation. Numerous changes to the disclosed embodiments can be made in accordance with the disclosure herein without departing from the spirit or scope of those embodiments. Thus, the breadth and scope of the embodiments should be defined in accordance with the following claims.

What is claimed is:

1. A method of operating an integrated circuit containing an SRAM cell array, comprising:
   writing a low data bit value to an addressed SRAM cell in said SRAM cell array, by the method further including the steps of:
      adjusting a bias potential on a first n-well in said addressed SRAM cell whereby a ratio of an on-state current of a bit passgate transistor in said addressed SRAM cell to an on-state current of a bit driver transistor in said addressed SRAM cell is increased;
      adjusting a bias potential on a second n-well in said addressed SRAM cell whereby a ratio of an on-state current of a bit-bar passgate transistor in said addressed SRAM cell to an on-state current of a bit-bar driver transistor in said addressed SRAM cell is increased;
      coupling a bit data line in said addressed SRAM cell to a low voltage;
      coupling a bit-bar data line in said addressed SRAM cell to a high voltage; and
      coupling a word line in said addressed SRAM cell to said low voltage;
   writing a high data bit value to said addressed SRAM cell, by a process further including the steps of:
      adjusting said bias potential on said first n-well in said addressed SRAM cell whereby said ratio of said on-state current of said bit passgate transistor in said addressed SRAM cell to said on-state current of said bit driver transistor in said addressed SRAM cell is increased;
      adjusting said bias potential on said second n-well in said addressed SRAM cell whereby said ratio of said on-state current of said bit-bar passgate transistor in said addressed SRAM cell to said on-state current of a bit-bar driver transistor in said addressed SRAM cell is increased;
      coupling said bit data line in said addressed SRAM cell to said high voltage;
      coupling said bit-bar data line in said addressed SRAM cell to said low voltage; and
      coupling said word line in said addressed SRAM cell to said low voltage; and
   reading a data bit value from said addressed SRAM cell, by a process further including the steps of:
      adjusting said bias potential on said first n-well in said addressed SRAM cell whereby said ratio of said on-state current of said bit passgate transistor in said addressed SRAM cell to said on-state current of said bit driver transistor in said addressed SRAM cell is decreased;
      adjusting said bias potential on said second n-well in said addressed SRAM cell whereby said ratio of said on-state current of said bit-bar passgate transistor in said addressed SRAM cell to said on-state current of a bit-bar driver transistor in said addressed SRAM cell is decreased;
      coupling said bit data line in said addressed SRAM cell to said low voltage;
      coupling said bit-bar data line in said addressed SRAM cell to said low voltage;
      floating said bit data line in said addressed SRAM cell;
      floating said bit-bar data line in said addressed SRAM cell; and connecting said word line in said addressed SRAM cell to said low voltage.

2. The method of claim 1, in which:

said step of adjusting said bias potential on said first n-well in said step of writing said low data bit value further includes forward biasing said first n-well;

said step of adjusting said bias potential on said second n-well in said step of writing said low data bit value further includes forward biasing said second n-well;

said step of adjusting said bias potential on said first n-well in said step of writing said high data bit value further includes forward biasing said first n-well;

said step of adjusting said bias potential on said second n-well in said step of writing said high data bit value further includes forward biasing said second n-well;

said step of adjusting said bias potential on said first n-well in said step of reading said data bit value further includes reverse biasing said first n-well; and said step of adjusting said bias potential on said second n-well in said step of reading said data bit value further includes reverse biasing said second n-well.

3. The method of claim 2, in which:

said step of writing said low data bit value further includes the steps of:
 reverse biasing a first n-well in a half-addressed SRAM cell; and
 reverse biasing a second n-well in said half-addressed SRAM cell;

said step of writing said high data bit value further includes the steps of:
 reverse biasing said first n-well in said half-addressed SRAM cell; and
 reverse biasing said second n-well in said half-addressed SRAM cell;

said step of reading said data bit value further includes the steps of:
 reverse biasing said first n-well in said half-addressed SRAM cell; and
 reverse biasing said second n-well in said half-addressed SRAM cell.

4. The method of claim 1, in which:

said step of adjusting said bias potential on said first n-well in said step of writing said low data bit value further includes reverse biasing said first n-well;

said step of adjusting said bias potential on said second n-well in said step of writing said low data bit value further includes forward biasing said second n-well;

said step of adjusting said bias potential on said first n-well in said step of writing said high data bit value further includes reverse biasing said first n-well;

said step of adjusting said bias potential on said second n-well in said step of writing said high data bit value further includes forward biasing said second n-well;

said step of adjusting said bias potential on said first n-well in said step of reading said data bit value further includes forward biasing said first n-well; and said step of adjusting said bias potential on said second n-well in said step of reading said data bit value further includes reverse biasing said second n-well.

5. The method of claim 4, in which:

said step of writing said low data bit value further includes the steps of:
 forward biasing a first n-well in a half-addressed SRAM cell; and
 reverse biasing a second n-well in said half-addressed SRAM cell;

said step of writing said high data bit value further includes the steps of:
 forward biasing said first n-well in said half-addressed SRAM cell; and
 reverse biasing said second n-well in said half-addressed SRAM cell;

said step of reading said data bit value further includes the steps of:
 forward biasing said first n-well in said half-addressed SRAM cell; and
 reverse biasing said second n-well in said half-addressed SRAM cell.

6. The method of claim 1, further including the step of transitioning to a standby mode, by a process further including the steps of:
 coupling said word line in said addressed SRAM cell to said high voltage;
 reverse biasing said first n-well; and
 reverse biasing said second n-well.

7. A method of operating an integrated circuit containing an SRAM cell array, comprising:

writing a low data bit value to an addressed SRAM cell in said SRAM cell array, by a method further including the steps of:
 reverse biasing a first n-well in said addressed SRAM cell;
 forward biasing a second n-well in said addressed SRAM cell;
 coupling a bit data line in said addressed SRAM cell to a low voltage; and
 coupling a word line in said addressed SRAM cell to said low voltage;

writing a high data bit value to said addressed SRAM cell, by a method further including the steps of:
 reverse biasing said first n-well in said addressed SRAM cell;
 forward biasing said second n-well in said addressed SRAM cell;
 coupling said bit data line in said addressed SRAM cell to a high voltage; and
 coupling said word line in said addressed SRAM cell to said low voltage; and reading a data bit value from said addressed SRAM cell, by a method further including the steps of:
 forward biasing said first n-well in said addressed SRAM cell;
 reverse biasing said second n-well in said addressed SRAM cell;
 coupling said bit data line in said addressed SRAM cell to said low voltage;
 floating said bit data line in said addressed SRAM cell; and
 coupling said word line in said addressed SRAM cell to said low voltage.

8. The method of claim 7, in which:

said step of writing said low data bit value further includes the steps of:
 forward biasing a first n-well in a half-addressed SRAM cell; and
 reverse biasing a second n-well in said half-addressed SRAM cell;

said step of writing said high data bit value further includes the steps of:
 forward biasing said first n-well in said half-addressed SRAM cell; and
 reverse biasing said second n-well in said half-addressed SRAM cell;

said step of reading said data bit value further includes the steps of:
- forward biasing said first n-well in said half-addressed SRAM cell; and
- reverse biasing said second n-well in said half-addressed SRAM cell.

9. The method of claim 7, further including the step of transitioning to a standby mode, by a process further including the steps of:
- coupling said word line in said addressed SRAM cell to said high voltage;
- reverse biasing said first n-well; and
- reverse biasing said second n-well.

10. The method of claim 7, in which:
- each said SRAM cell further includes a third n-well;
- said step of writing said low data bit value further includes the step of reverse biasing said third n-well in said addressed SRAM cell;
- said step of writing said high data bit value further includes the step of reverse biasing said third n-well in said addressed SRAM cell; and
- said step of reading said data bit value further includes the step of forward biasing said third n-well in said addressed SRAM cell.

11. The method of claim 10, in which:
- said step of writing said low data bit value further includes the step of forward biasing a third n-well in a half-addressed SRAM cell;
- said step of writing said high data bit value further includes the step of forward biasing said third n-well in said half-addressed SRAM cell; and
- said step of reading said data bit value further includes the step of forward biasing said third n-well in said half-addressed SRAM cell.

12. The method of claim 10, further including the step of transitioning to a standby mode, by a process further including the steps of:
- coupling said word line in said addressed SRAM cell to a high voltage;
- reverse biasing said first n-well;
- reverse biasing said second n-well; and
- reverse biasing said third n-well.

* * * * *